United States Patent [19]

Cronin et al.

[11] Patent Number: 5,521,434
[45] Date of Patent: May 28, 1996

[54] SEMICONDUCTOR CHIP AND ELECTRONIC MODULE WITH INTEGRATED SURFACE INTERCONNECTS/COMPONENTS

[75] Inventors: John E. Cronin, Milton; Stephen E. Luce, Underhill; Steven H. Voldman, Burlington, all of Vt.

[73] Assignee: International Business Machines Corporation, Armonk, N.Y.

[21] Appl. No.: 324,203

[22] Filed: Oct. 17, 1994

[51] Int. Cl.$^6$ .................. H01L 23/528; H01L 23/538
[52] U.S. Cl. .................. 257/686; 257/777; 257/528; 257/532; 257/536
[58] Field of Search .................. 257/686, 67, 68, 257/71, 74, 304, 301, 305, 311, 516, 528, 532, 533, 536, 684, 685, 777

[56] References Cited

U.S. PATENT DOCUMENTS

| | | | |
|---|---|---|---|
| 4,630,096 | 12/1986 | Drye et al. | 257/684 |
| 4,953,005 | 8/1990 | Carlson et al. | 357/80 |
| 4,983,533 | 1/1991 | Go | 437/7 |
| 5,107,586 | 4/1992 | Eichelberger et al. | 29/830 |
| 5,151,768 | 9/1992 | Aso | 257/532 |
| 5,155,573 | 10/1992 | Abe et al. | 257/532 |
| 5,186,632 | 2/1993 | Horton et al. | 439/67 |
| 5,202,754 | 4/1993 | Bertin et al. | 257/684 |
| 5,266,833 | 11/1993 | Capps | 257/690 |
| 5,270,261 | 12/1993 | Bertin et al. | 437/209 |
| 5,275,974 | 1/1994 | Ellul et al. | 437/203 |
| 5,304,838 | 4/1994 | Ozawa | 257/542 |
| 5,316,978 | 5/1994 | Boyd et al. | 257/536 |
| 5,382,827 | 1/1995 | Wang et al. | 257/686 |

FOREIGN PATENT DOCUMENTS 0121967  7/1984  Japan ................ 257/536

*Primary Examiner*—Robert P. Limanek
*Assistant Examiner*—Alexander Oscar Williams
*Attorney, Agent, or Firm*—Heslin & Rothenberg

[57] ABSTRACT

A fabrication method and resultant electronic module having one or more surfaces enhanced with interconnects and components. Electronic modules having, for example, resistors and capacitors integral with a side surface thereof are disclosed. Further described are electronic modules with interconnects electrically attaching for example, side to side, or side to end surfaces are described. Moreover, discussion of an electronic module having a Silicon Front Face chip is contained herein. Specific details of the fabrication method, resulting electronic module, and related wafer processing are set forth.

36 Claims, 16 Drawing Sheets

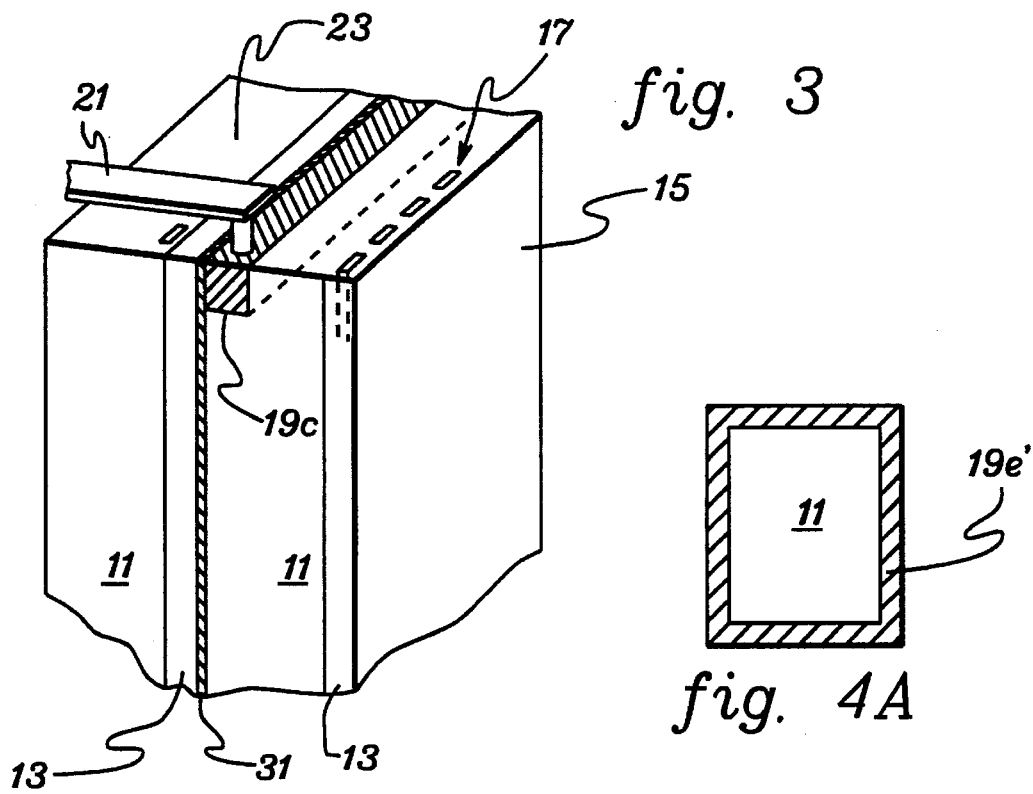
fig. 3
fig. 4A
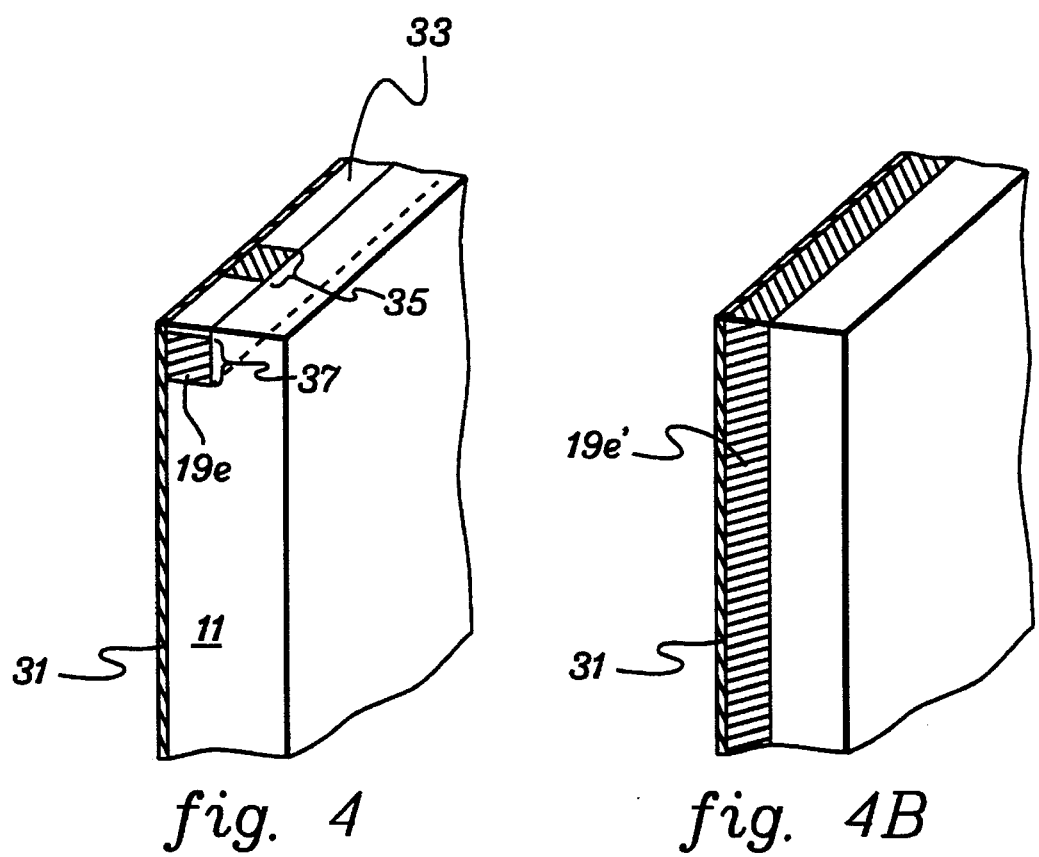
fig. 4
fig. 4B

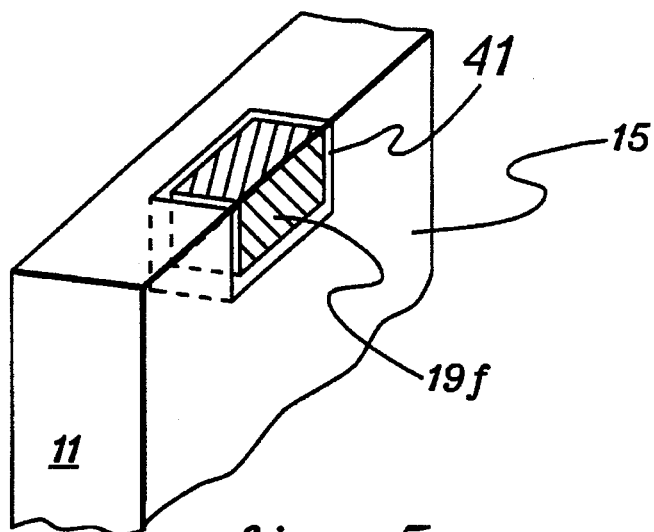
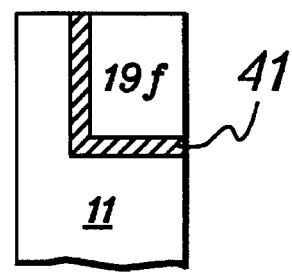
fig. 5     fig. 5a
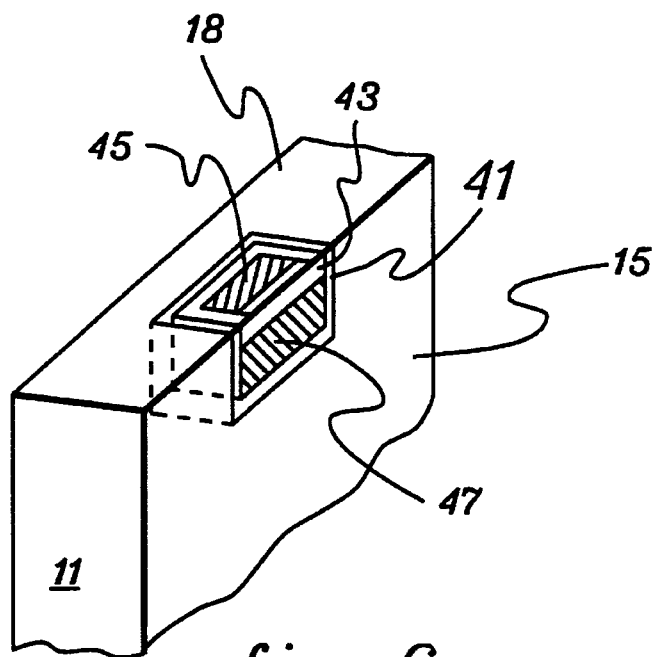
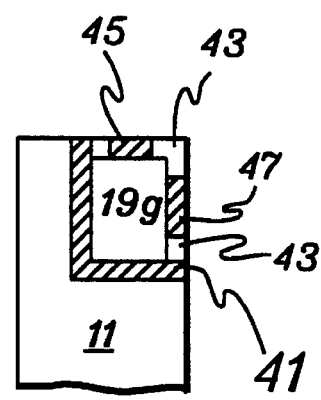
fig. 6     fig. 6a 5,521,434

SEMICONDUCTOR CHIP AND ELECTRONIC MODULE WITH INTEGRATED SURFACE INTERCONNECTS/COMPONENTS

TECHNICAL FIELD

The present invention relates in general to high density electronic packaging. More particularly, this invention relates to a technique for interconnecting the surfaces of an electronic module comprising a densely stacked array of multiple semiconductor chips. The invention also relates to a technique for forming components on a side surface of an electronic module.

BACKGROUND OF THE INVENTION

Since the development of integrated circuit technology, computers and computer storage devices have been made from integrated circuit ("IC") chips formed from wafers of semiconductor material. After a wafer is made, the chips are typically separated from each other by dicing the wafer. Thereafter, the individual chips are bonded to carriers of various types, interconnected by wires and packaged. Such "two-dimensional" packages of chips fail to optimize the number of circuits that might be fabricated in a given space, and also introduce undesirable signal delays, capacitance, and inductance as signals travel between chips.

Recently, electronic modules comprising three-dimensional arrays of chips have emerged as an important packaging approach. A typical three-dimensional dimensional electronic module consists of multiple integrated circuit chips adhesively secured together as a monolithic structure (a "stack"). A metallization pattern is often provided directly on one (or more) side surface(s) of the electronic module for interconnecting the chips in the stack and for electrical connection of the stack to circuitry external to the module. The metallization pattern can include both individual contacts and bus contacts.

One significant aspect in the fabrication of electronic modules is the electrical interconnection between surfaces of the module. For example, interconnection between the front face of a module (defined by a substantially planar main surface of an end semiconductor chip in the stack) is typically performed by use of a ceramic end cap. The front surface of the ceramic end cap contains metallized contacts for external connection. Electrically conductive vias originating from these contacts are etched completely through to the back surface of the cap. Back surface metallization then extends from the vias to edges of the end cap (corresponding to side surfaces of the module), connecting to side surface metallization. This interconnect scheme is complex and costly with respect to the fabrication of electronic modules.

Another significant consideration in the fabrication of electronic modules is the dissipation of electrostatic discharge ("ESD"). ESD in electronic modules produces high current densities, which cause local heating as the ESD passes through resistive epitaxial regions. This may cause destruction of circuits and wiring within the chips of the module.

Another significant problem in high density electronic modules is impedance mismatching, which results in ring-back. Specifically, in electronic modules, ring-back is a problem since the loading of signals is different depending on which chips in the module are accessed. Thus, significant additional componentry (such as resistors and capacitors) is needed external to electronic modules to account for various impedance mismatch problems. Further, decoupling of power supply voltages requires significant amounts of external capacitance.

The present invention is directed towards solving these problems.

DISCLOSURE OF THE INVENTION

Briefly described, the present invention comprises, in a first aspect, a component enhanced electronic module including an electronic module having a plurality of stacked integrated circuit ("IC") chips and having a substantially planar surface. An electronic component is formed integral with the substantially planar surface of the electronic module. As an enhancement, the substantially planar surface of the electronic module may comprise a substantially planar side surface of the electronic module.

In another aspect, the present invention comprises an interconnect enhanced electronic module including an electronic module comprising a plurality of stacked semiconductor chips. The electronic module has a first substantially planar surface and a second substantially planar surface, the second substantially planar surface being perpendicular to the first.

Specifically, the interconnect enhanced electronic module includes an interconnect comprising an at least partially conductor filled notch. The interconnect intersects both the first and second substantially planar surfaces of the electronic module and has a first contact surface and a second contact surface. The first contact surface is parallel to the first substantially planar surface of the electronic module, and the second contact surface is parallel to the second substantially planar surface of the electronic module. Accordingly, the interconnect facilitates electrical interconnection between to the first substantially planar surface of the electronic module and the second substantially planar surface of the electronic module.

In yet another aspect, the present invention comprises an interconnect enhanced semiconductor chip. The chip has a first substantially planar surface and a second substantially planar surface, the second substantially planar surface being perpendicular to the first. Further, the interconnect enhanced semiconductor chip comprises an interconnect including an at least partially conductor filled notch. The interconnect intersects both the first and second substantially planar surfaces of the semiconductor chip.

In particular, the interconnect has a first and second contact surface. The first contact surface being parallel to the first substantially planar surface of the semiconductor chip and the second contact surface being parallel to the second substantially planar surface of the semiconductor chip. The interconnect facilitates electrical interconnection between the first substantially planar surface of the semiconductor chip and the second substantially planar surface of the semiconductor chip.

An alternate aspect of the present invention includes a method for forming a component enhanced electronic module. The method includes the steps of providing an electronic module comprising a plurality of stacked integrated circuit ("IC") chips and having a substantially planar surface. An electronic component is formed integral with the substantially planar surface of the electronic module.

As a further enhancement, forming the electronic component may include depositing a first conductor above an insulating layer deposited in the notch, the conductor facilitating electrical connection to the electronic component. A dielectric layer may be deposited above the conductor. Furthermore, a second conductor may be deposited above the dielectric layer, the second conductor facilitating electrical contact with the electronic component.

In another aspect, the present invention comprises a method for forming an interconnect enhanced electronic module. The method includes providing an electronic module comprising a plurality of stacked semiconductor chips and having a first substantially planar surface and a second substantially planar surface.

The process further includes forming a notch within the electronic module, the notch intersecting both the first and second substantially planar surfaces of the electronic module. The notch is at least partially filled with a conductor to form an interconnect having a first contact surface substantially parallel to the first substantially planar surface of the electronic module and a second contact surface parallel to the second substantially planar surface of the electronic module. The interconnect facilitates electrical interconnection between the first and second substantially planar surfaces of the electronic module, respectively.

In yet another aspect, the present invention includes a method for forming an interconnect enhanced semiconductor chip. The method includes providing a semiconductor chip on a wafer, the chip having a first substantially planar surface. A notch is formed within the semiconductor chip intersecting the first substantially planar surface. The notch is at least partially filled with a conductor to form an interconnect having a first contact surface parallel to the first substantially planar surface of the semiconductor chip.

The semiconductor chip is then diced from the wafer forming an edge surface of the semiconductor chip. The edge surface is planarized forming a substantially planar edge surface having a second contact surface of the interconnect exposed thereon. The interconnect facilitates electrical interconnection between the substantially planar edge surface of the semiconductor chip and the first substantially planar surface of the semiconductor chip.

The semiconductor structures and methods of the present invention include numerous advantages. An interconnect enhanced electronic module has simplified connections between surfaces of the electronic module. For example, two side surface metallization patterns may be interconnected by adjoining them to a common interconnect in accordance with the present invention. Similarly, an end surface metallization pattern may be interconnected to a side surface metallization pattern. Such technique eliminates the fabrication and reliability problems associated with modified T-Connects, and other interconnects that "wrap around" an edge surface of an electronic module.

Further advantages are derived when a main surface conductor is disposed on a semiconductor chip and electrically attached to an interconnect as proposed herein. Main surface conductors facilitate electrostatic discharge ("ESD") removal since they draw the ESD impulse to the bulk substrate, and away from the resistive epitaxial regions of the chip.

Further, the techniques of the present invention allow for the elimination of the conventional ceramic end cap, and associated costly processing. An interconnect as described herein is used to connect a side surface to an end surface on the electronic module. The interconnect thus replaces the function of the ceramic end cap. This interconnect may be easily formed either after fabrication of the electronic module, or on a silicon wafer prior to dicing the wafer into chips for inclusion in the electronic module.

As yet another advantage, components formed integral with a surface of an electronic module facilitate a better performing electronic module. The component enhanced electronic module may be used to eliminate ring back associated with impedance mismatch. Further, the components may provide a power supply decoupling function. All of this is provided directly on the electronic module, without the need for the inclusion of componentry (resistors and capacitors) on external circuit boards.

Further, it is the spirit of this invention to provide a generalized structure and method for providing interconnections, and/or electrical devices in the edges of semiconductor chips in an electronic module, which has heretofor never been described.

BRIEF DESCRIPTION OF THE DRAWINGS

The subject matter which is regarded as the present invention is particularly pointed out and distinctly claimed in the concluding portion of the Specification. The invention, however, both as to organization and method of practice, together with further objects and advantages thereof, may best be understood by reference to the following detailed description taken in conjunction with the accompanying drawings in which:

FIG. 3 is a partial perspective view of an interconnect enhanced electronic module according to an embodiment of the present invention having a side surface to side surface interconnect electrically connected to a main surface conductor;

FIG. 4 is a partial perspective view of a semiconductor chip (of an interconnect enhanced electronic module) having a main surface conductor electrically connected to a side surface to side surface interconnect that is partially covered by an insulating layer according to an embodiment of the present invention;

FIG. 4A is a cross sectional view of an embodiment of a semiconductor chip (of an interconnect enhanced electronic module) having a "ring" interconnect adjacent to four edge surfaces;

FIG. 4B is a perspective view of the chip of FIG. 4 according to the present invention;

FIGS. 6 and 6a are a partial perspective view and a side cross-sectional view, respectively, of an alternate embodiment of the present invention in which the chip of FIGS. 5 and 5a has insulating layers partially covering the interconnect;

Figure 5B:
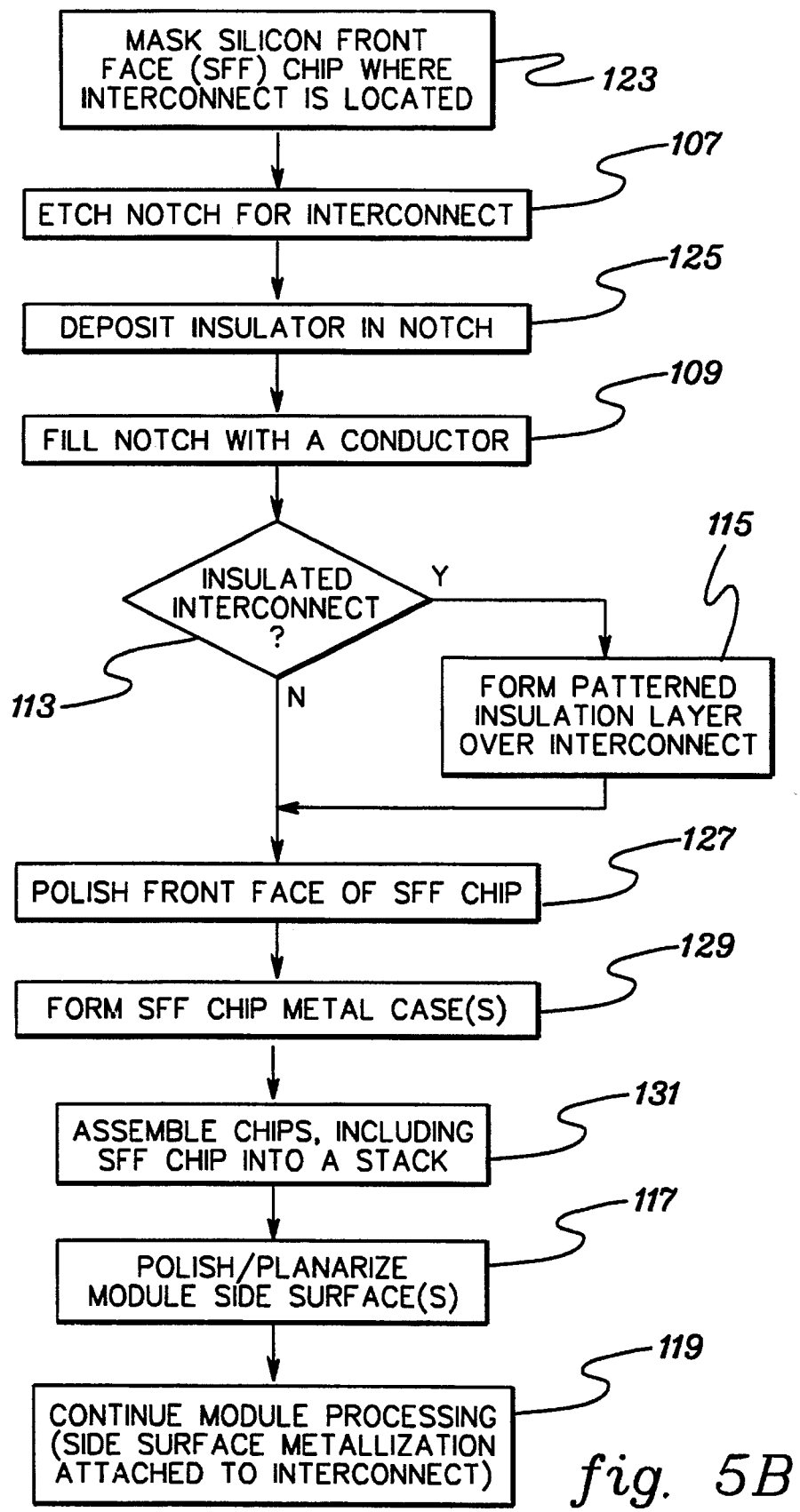
FIGS. 5 and 5a are a partial perspective view and a side cross-sectional view, respectively, of an interconnect enhanced semiconductor chip (for example, a silicon front face "SFF" chip) of an interconnect enhanced electronic module having a side surface to front surface interconnect according to one embodiment of the present invention.
Figure 7:
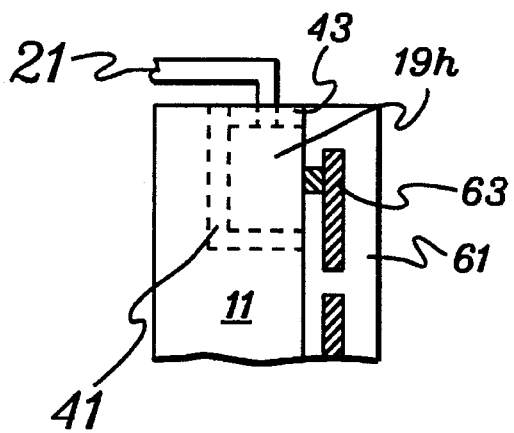
Figure 8:
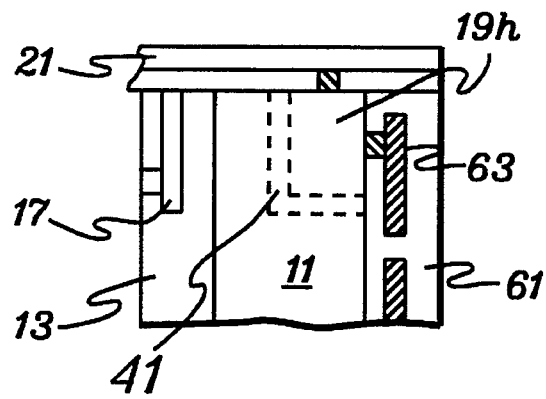
Figure 9:
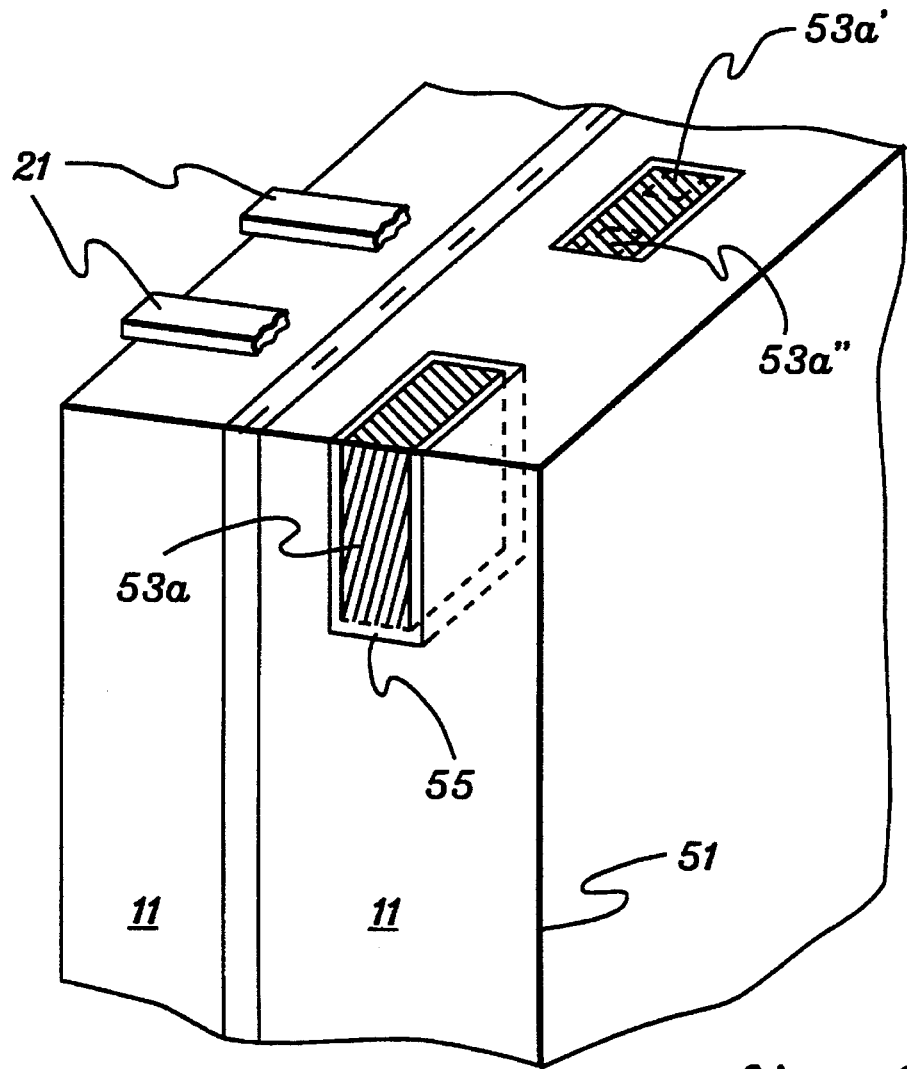
Figure 8A:
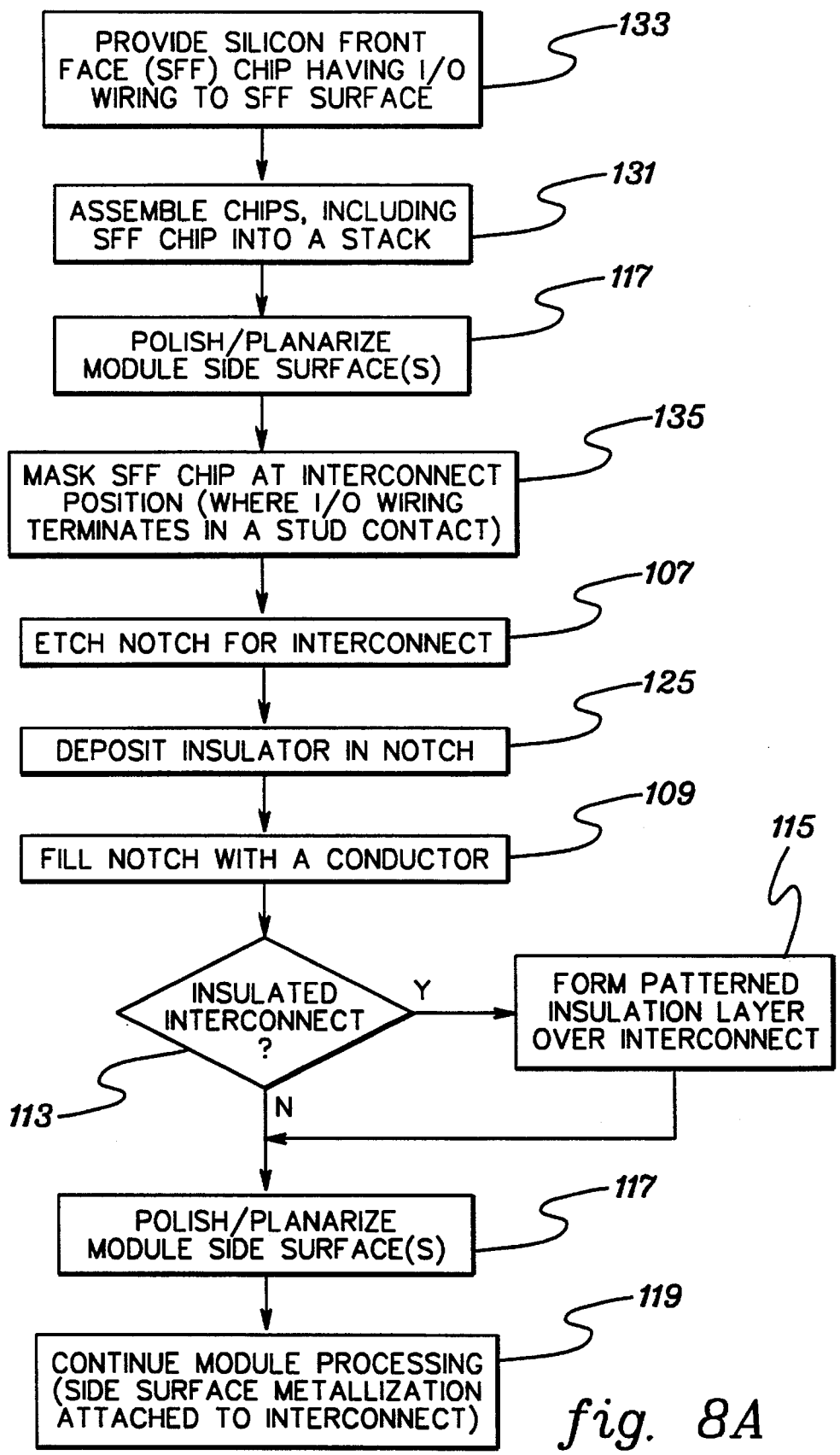
Figure 9A:
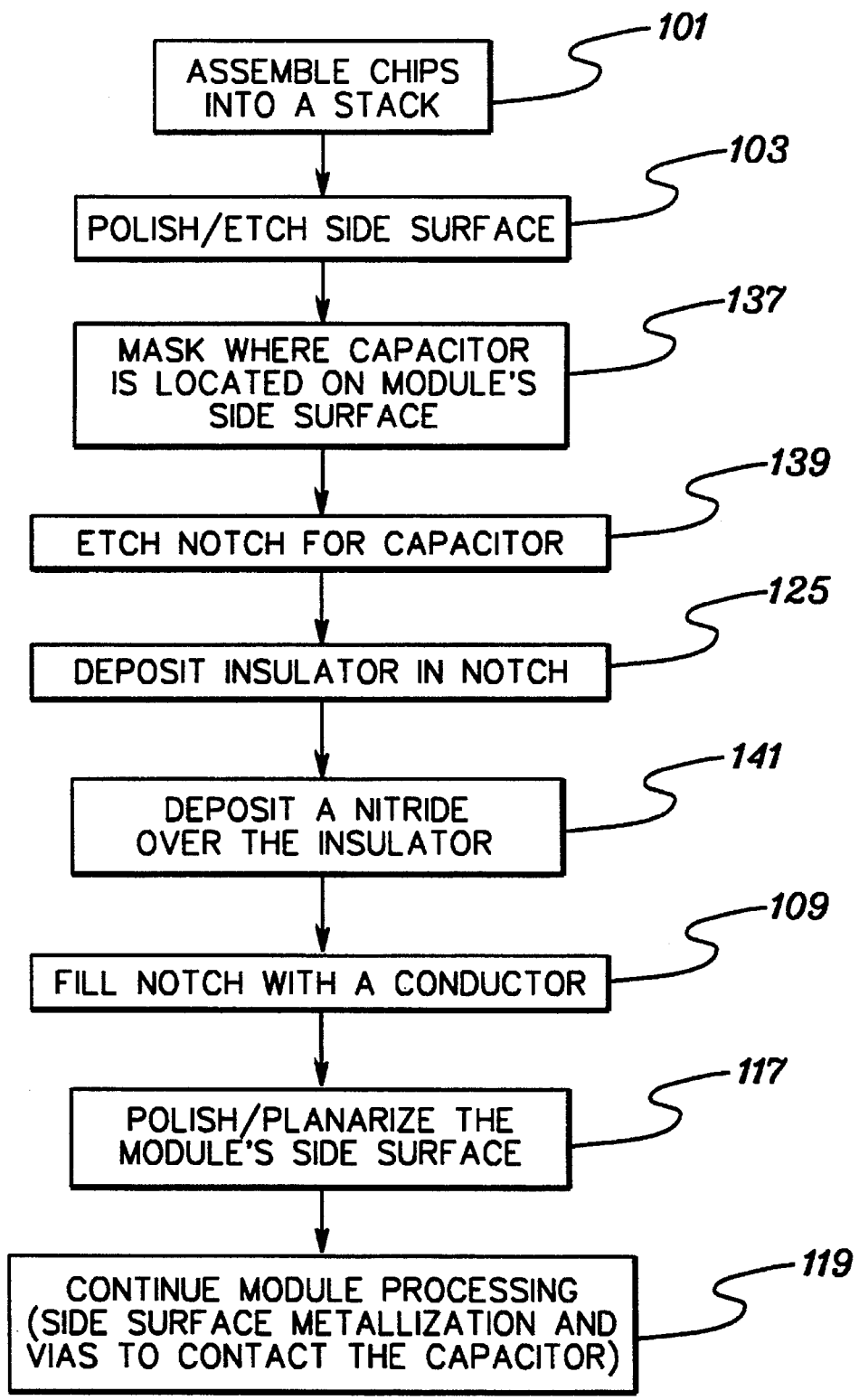
Figure 9B:
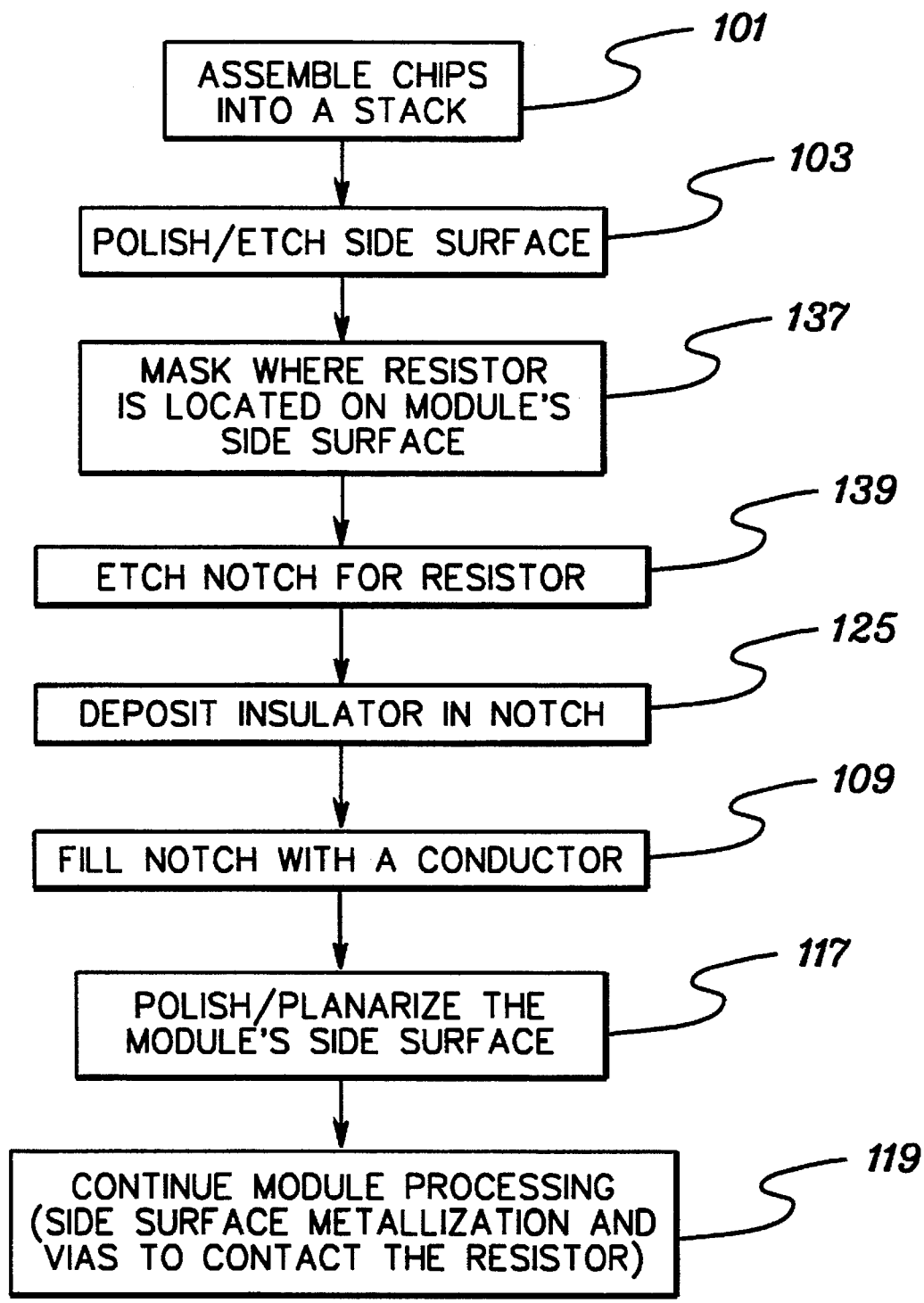
Figure 10:
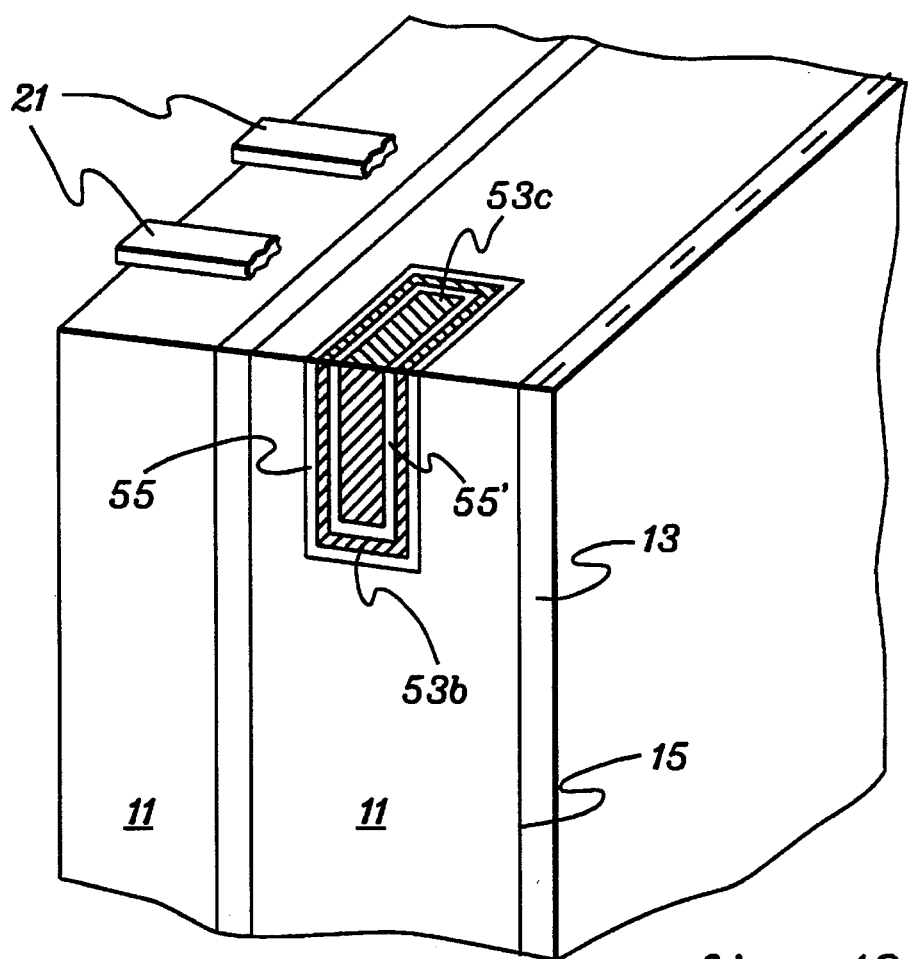
Figure 10A:
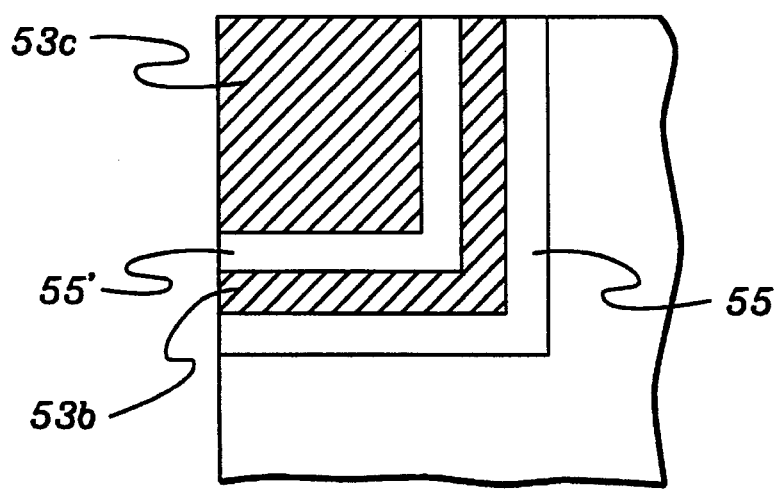
Figure 10B:
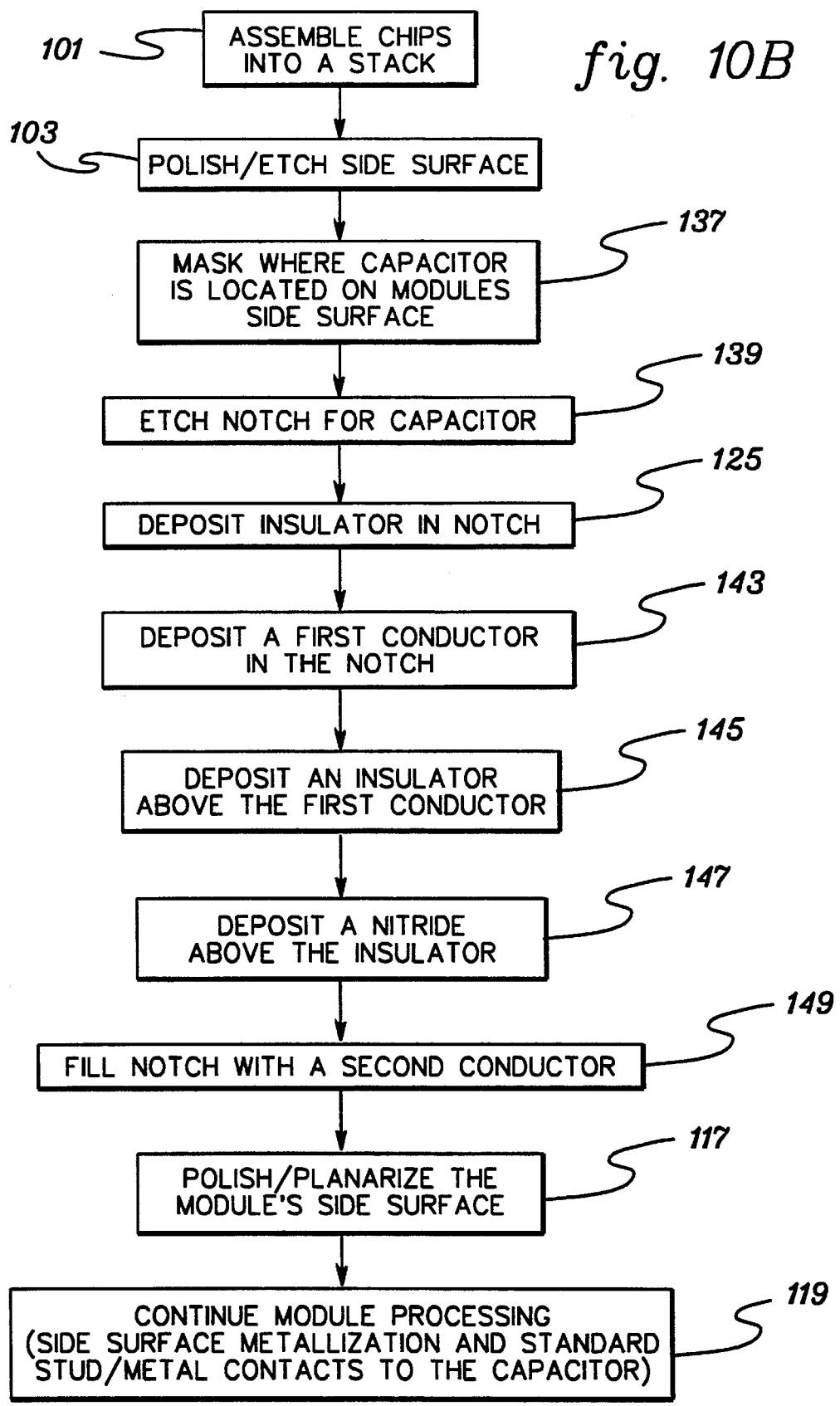
Figure 11:
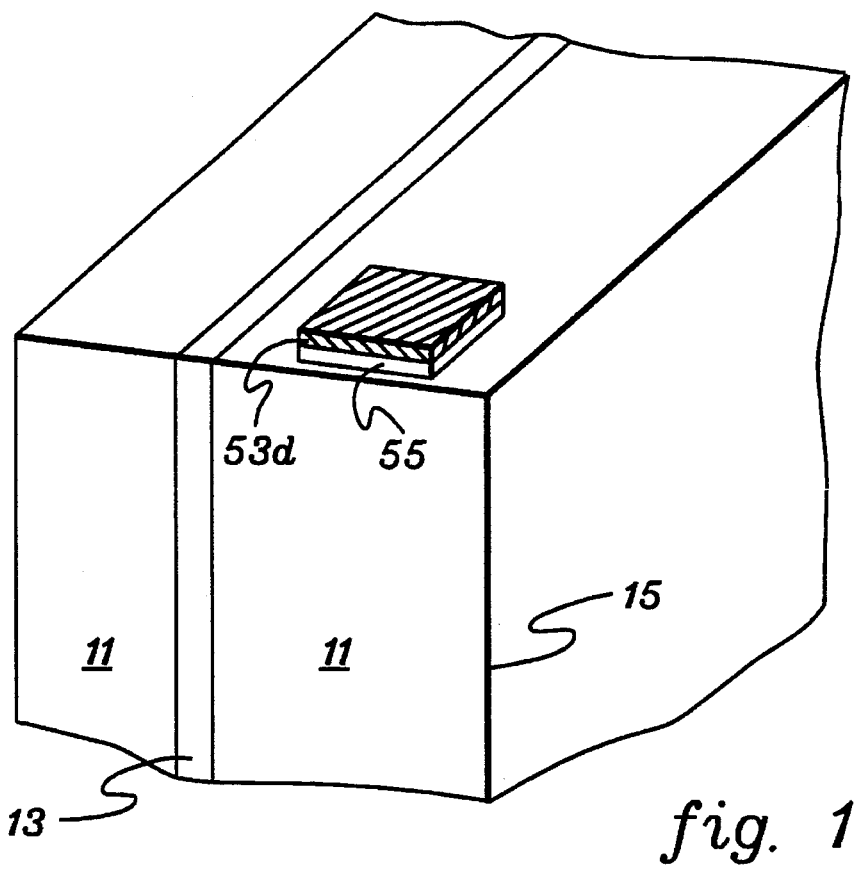
Figure 12:
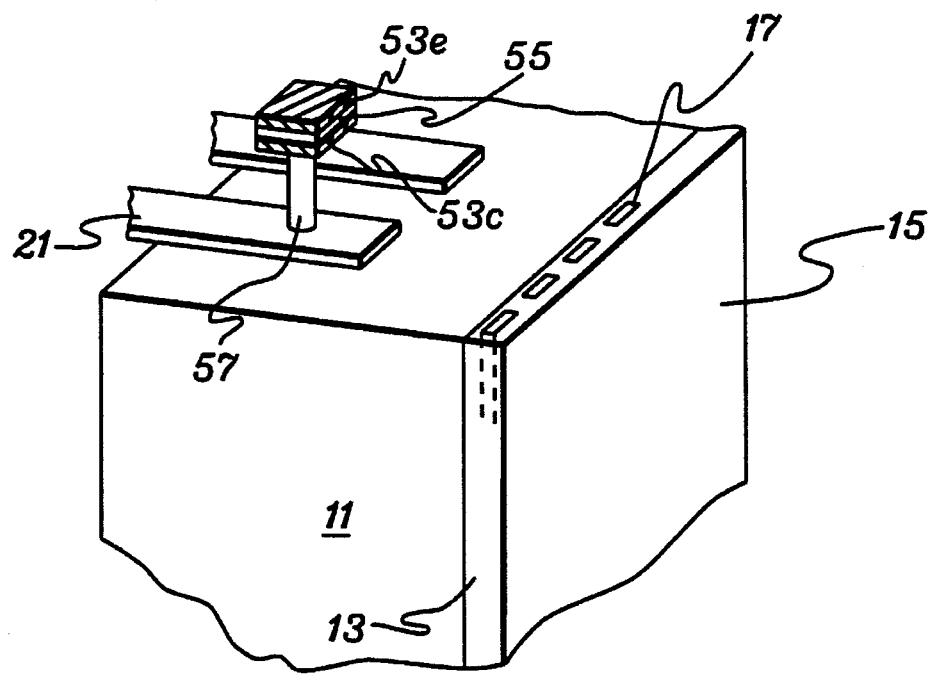
Figure 11A:
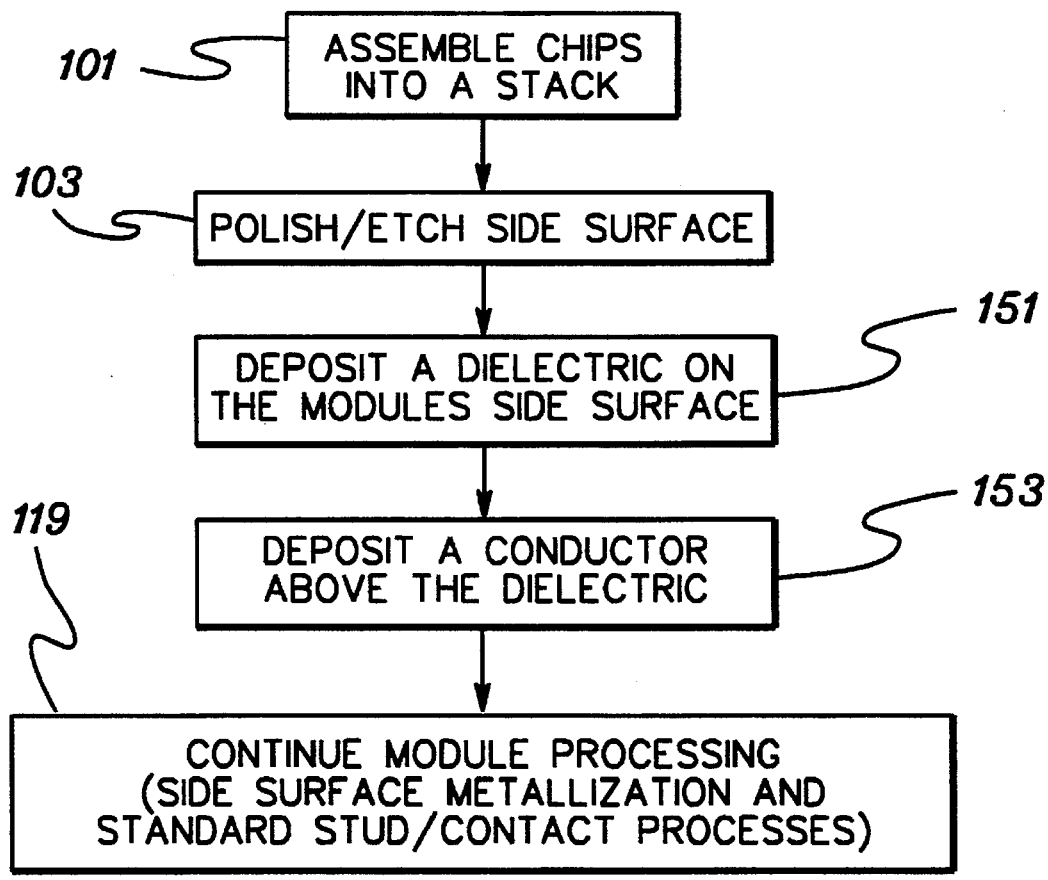
Figure 12A:
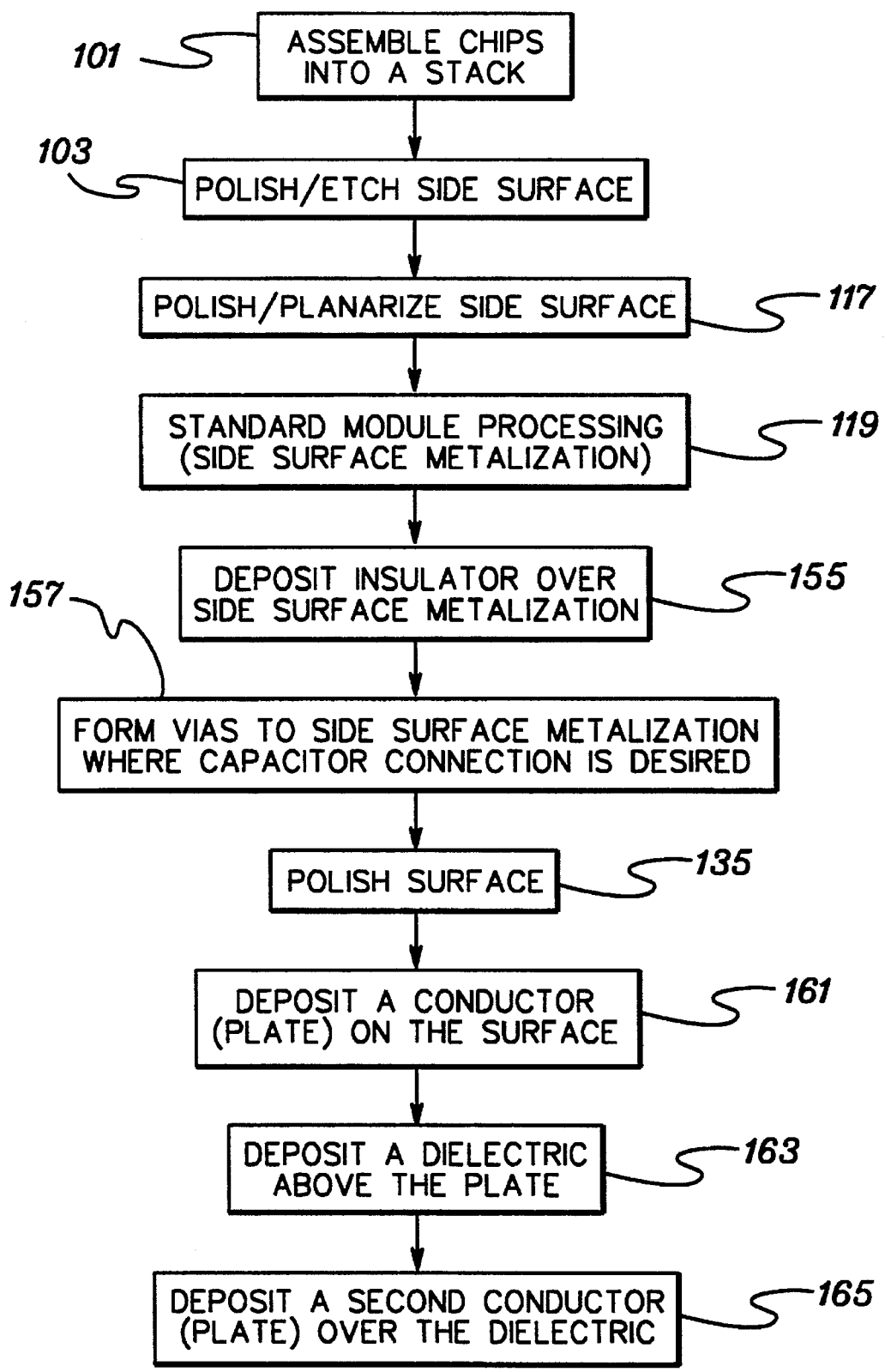
Figure 13:
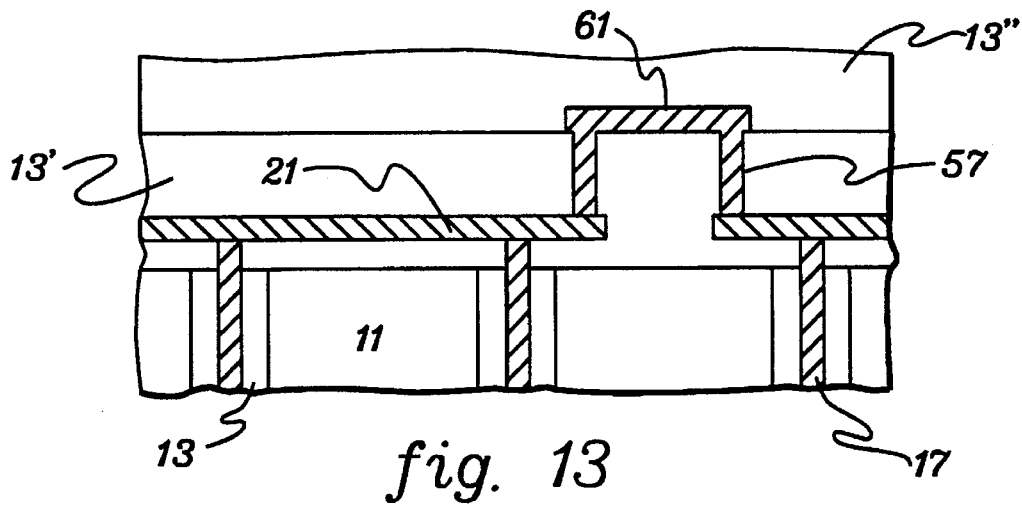
Figure 13A:
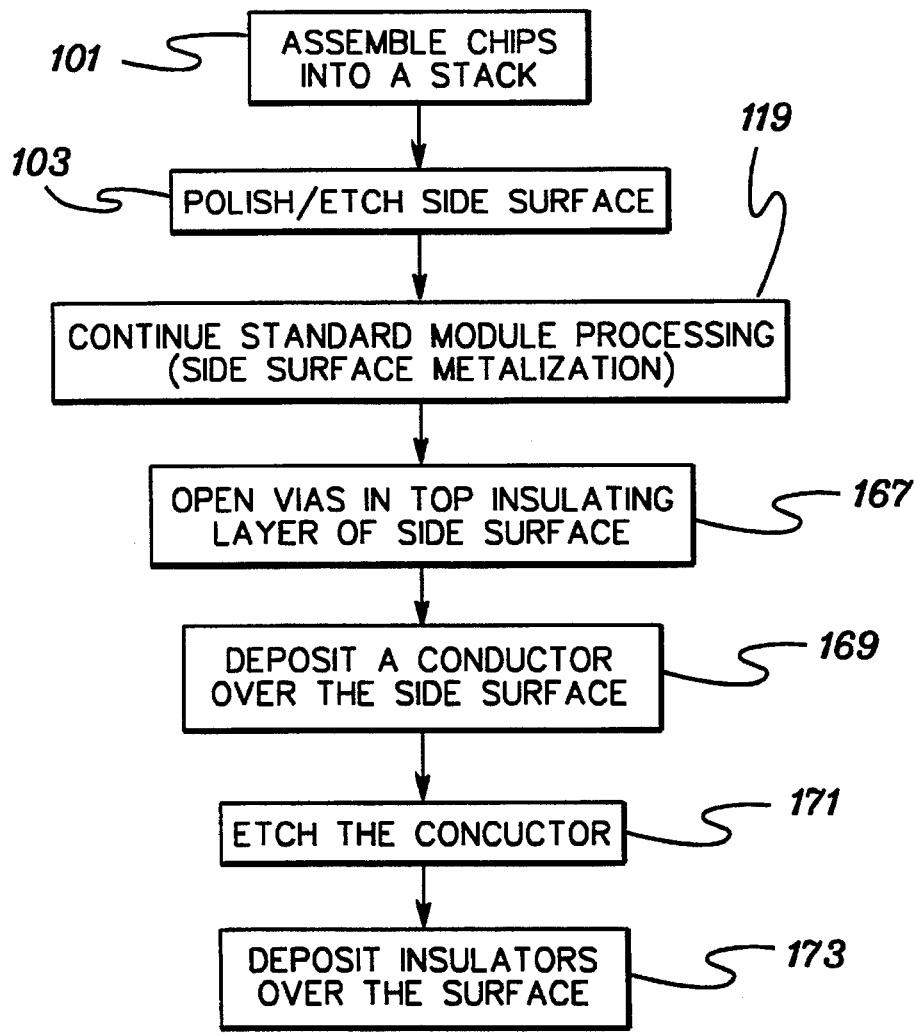

FIG. 5B is a flowchart of an embodiment showing a method for forming the interconnect enhanced semiconductor chips of FIGS. 5–6a;

FIG. 7 is a side schematic view of an end semiconductor chip of an interconnect enhanced electronic module having a side surface to end surface interconnect with an insulating layer in accordance with an embodiment of the present invention;

FIG. 8 is a side schematic view of an end semiconductor chip of an interconnect enhanced electronic module embodied in the present invention having a side surface to end surface interconnect;

FIG. 8A is a flowchart of one embodiment of a method for forming the end chip of the interconnect enhanced electronic modules of FIGS. 7 and 8;

FIG. 9 is a partial perspective view of a component enhanced electronic module embodiment having dual surface and single surface buried trench capacitor structures;

FIG. 9A is a flowchart showing a method for forming the component enhanced electronic module of FIG. 9 according to an embodiment of the present invention;

FIG. 9B is a flowchart of one embodiment of a method for forming a component enhanced electronic module with side surface resistors;

FIGS. 10 and 10a are a partial perspective view and a cross-sectional view, respectively, of a component enhanced electronic module of the present invention having a dual surface two-plate, buried capacitor structure;

FIG. 10B is a flowchart of an embodiment of a method for forming the component enhanced electronic module of FIGS. 10 and 10a;

FIG. 11 is a partial perspective view of a component enhanced electronic module embodied within the present invention having a side surface planar capacitor;

FIG. 11A is a flowchart showing a method for forming the component enhanced electronic module of FIG. 11 according to one embodiment of the present invention;

FIG. 12 is a partial perspective view of an embodiment including a component enhanced electronic module of the present invention having a stacked capacitor structure disposed above side surface metallization;

FIG. 12A is a flowchart of an embodiment of a method for forming the component enhanced electronic module with stacked capacitor structure of FIG. 12;

FIG. 13 is a cross sectional view of a component enhanced electronic module of one embodiment of the present invention having a side surface resistor disposed above side surface metallization; and FIG. 13A is a flowchart of an embodiment of a method for forming the component enhanced electronic module of FIG. 13 according to the present invention.

BEST MODE OF THE INVENTION

Certain preferred embodiments for forming interconnect and component enhanced electronic modules are presented herein. As set forth below, the structure of the interconnect enhanced electronic module of FIG. 1 will be described with respect to the steps of the method shown in the flowchart of FIG. 1A.

Figure 1:
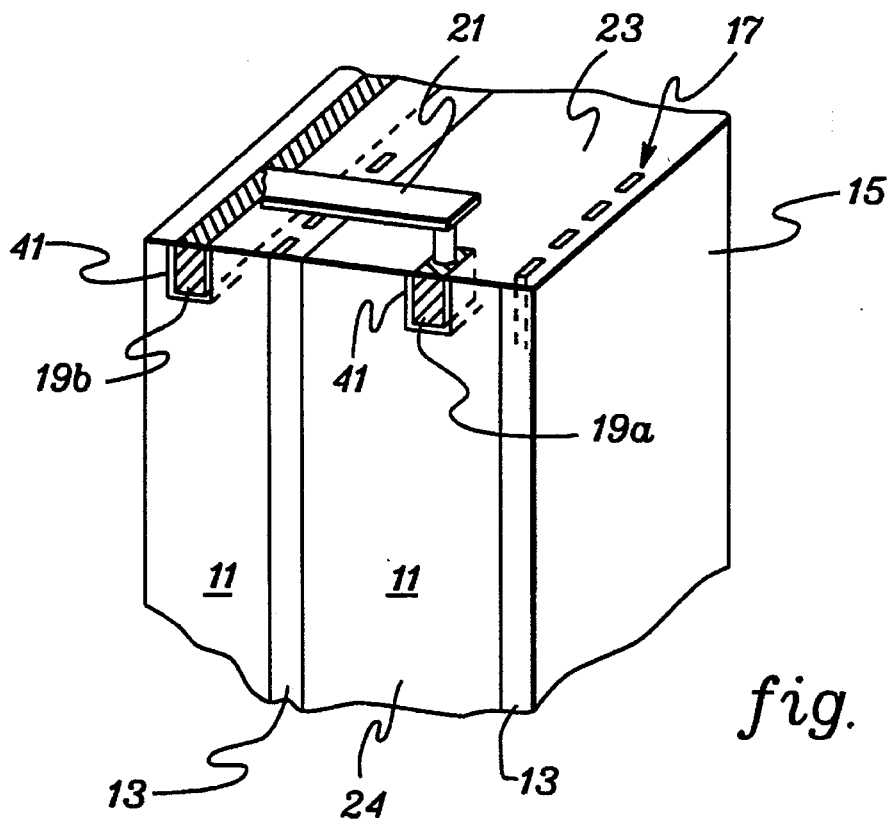
FIG. 1 is a partial perspective view of one embodiment of an interconnect enhanced electronic module in accordance with the present invention having side surface to side surface interconnect.
Figure 1A:
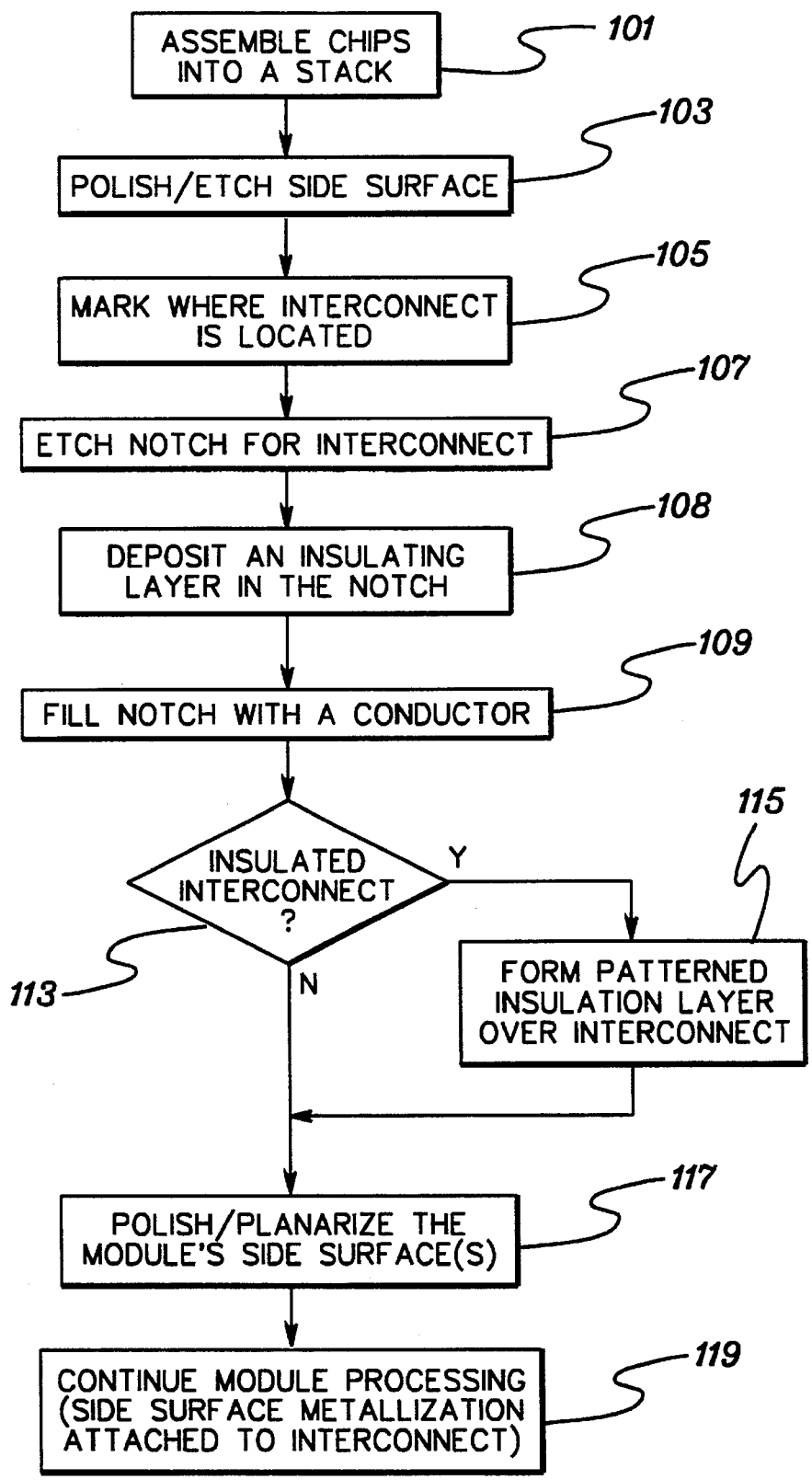
FIG. 1A is a flowchart of one embodiment of a method for forming the interconnect enhanced electronic module of FIG. 1.

An initial step, as shown in FIG. 1A, is the assembly of a plurality of semiconductor chips into a "stack" (101). The plurality of stacked semiconductor chips is known as an electronic module. Referring to FIG. 1, as shown, chips 11 are stacked to form the electronic module. Transfer metals 17 are associated with the chips, and may be used to interconnect the chips in the module or facilitate electrical connection to external circuitry. When stacked, transfer metals 17 extend towards at least one selected side surface 23 of the module. An insulating layer 13 is disposed between each chip, protecting the active circuit layer below it (not shown), and encasing the transfer metals 17. A thin adhesive layer (not shown) bonds the chips together. Assembly of such a module with respective elements and layers, is well known in the art.

After the chips have been laminated together into a "stack", a side surface of the module is polished or etched to form a substantially planar surface (FIG. 1, surface 23; FIG. 1A, step 103). The polishing or etching step is performed such that the ends of the transfer metals 17 are flush with the polished/etched side surface.

To continue, a next process step is the photolithographic masking of the side surface of the module, locating the interconnect to be formed (105). The mask may comprise a typical photolithography mask known in the art, and various mask shapes may be used to form a variety of various interconnects. As examples, referring to FIG. 1, interconnect 19a is a small side surface to side surface interconnect, while interconnect 19b is relatively small on one side surface and extends across an entire second side surface, perpendicular to the first.

After exposure and development of the masked module, the photolithography process continues with the etching of the exposed interconnect region to form a "notch" (107). Subsequently, the notch is filled with an insulator (FIG. 1A, step 108; FIG. 1, layer 41) and then a conductor (step 109) forming an "interconnect(s)" (FIG. 1, 19a, 19b) which is electrically insulated from the substrate. This conductor may comprise, for example, a metal or a conductive polymer. It should be generally noted that a "notch" may comprise any of a variety of openings intersecting one or more module surfaces; for example, pits, wells or cavities.

The side surfaces of the module that the interconnect intersects (FIG. 1, surfaces 23 and 24) are polished, planarizing the side surfaces (117). Thus, an "interconnect enhanced" electronic module has been fabricated having an interconnect electrically connecting two side surfaces. Specifically, the interconnect has two contact surfaces on the electronic module, corresponding to the two module side surfaces.

The process continues with the remaining standard processes for fabrication of electronic modules (119). Side surface metallization is applied to the module, interconnecting the various chips via transfer metals 17. In the present invention, the side surface metallization (21) connects to the interconnects. For example, as shown in FIG. 1, side surface metallization (21) is electrically attached to interconnect 19a. Another side surface metallization pattern associated with side surface 24 may attach to the associated contact surface of interconnect 19a (although it is not shown for clarity). Thus, two side surface metallization patterns are easily connected.

Figure 2:
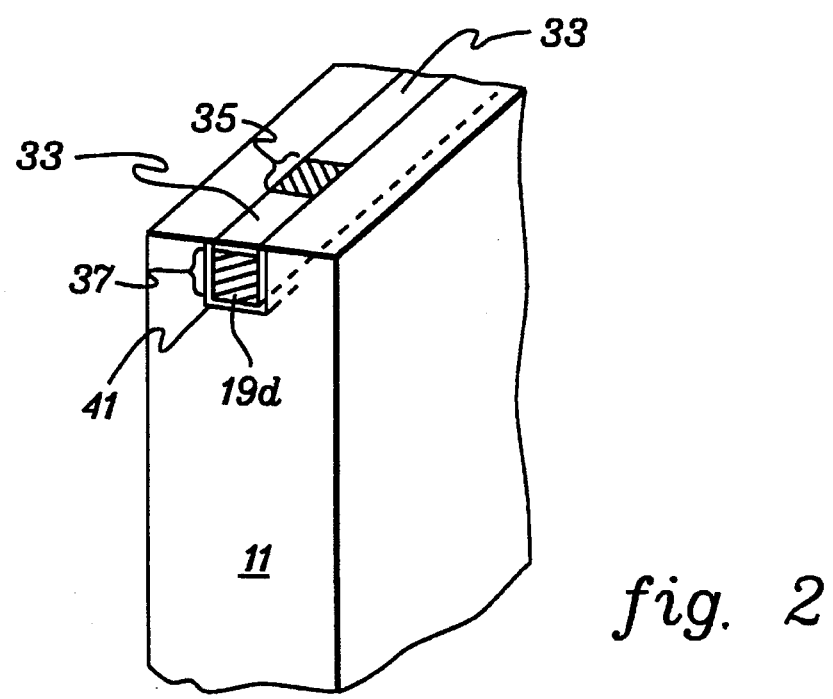
FIG. 2 is a partial perspective view of an IC chip (of an interconnect enhanced electronic module) of one embodiment of the present invention having a side surface to side surface interconnect partially covered by an insulating layer.

In an alternate embodiment of the present invention, portions of the interconnect may be insulated. In forming the electronic module containing the interconnect structure, a decision is made whether or not to insulate portions of the interconnect (FIG. 1A, step 113). If insulation is desired, a patterned insulation layer is formed over the interconnect (115). As shown in FIG. 2, insulator 33 covers all but a small (35) contact surface on interconnect 19*d*. The side surface metallization applied in a later process step would therefore electrically attach to the exposed contact surface of the interconnect. While insulation is only shown on one of the contact surfaces of the interconnect, a similar insulation layer may be deposited on other contact surfaces as well (on another surface of the module).

One technique according to the present invention for the handling (i.e., dissipation) of electrostatic discharge ("ESD") within an electronic module is the provisioning of a large conductor on a main (back) surface of a semiconductor chip of the module. As used herein, and known in the art, the "back" surface of a chip is typically the planar main surface of the chip void of active circuitry. In contrast, the "front" surface of the chip is typically the planar main surface containing active circuitry to which the transfer metals extend. This large conductor, when grounded, advantageously draws the ESD impulse away from the "active" elements of the chips. The techniques of the present invention may be used to provide a large surface area contact to a main surface conductor.

Figure 3A:
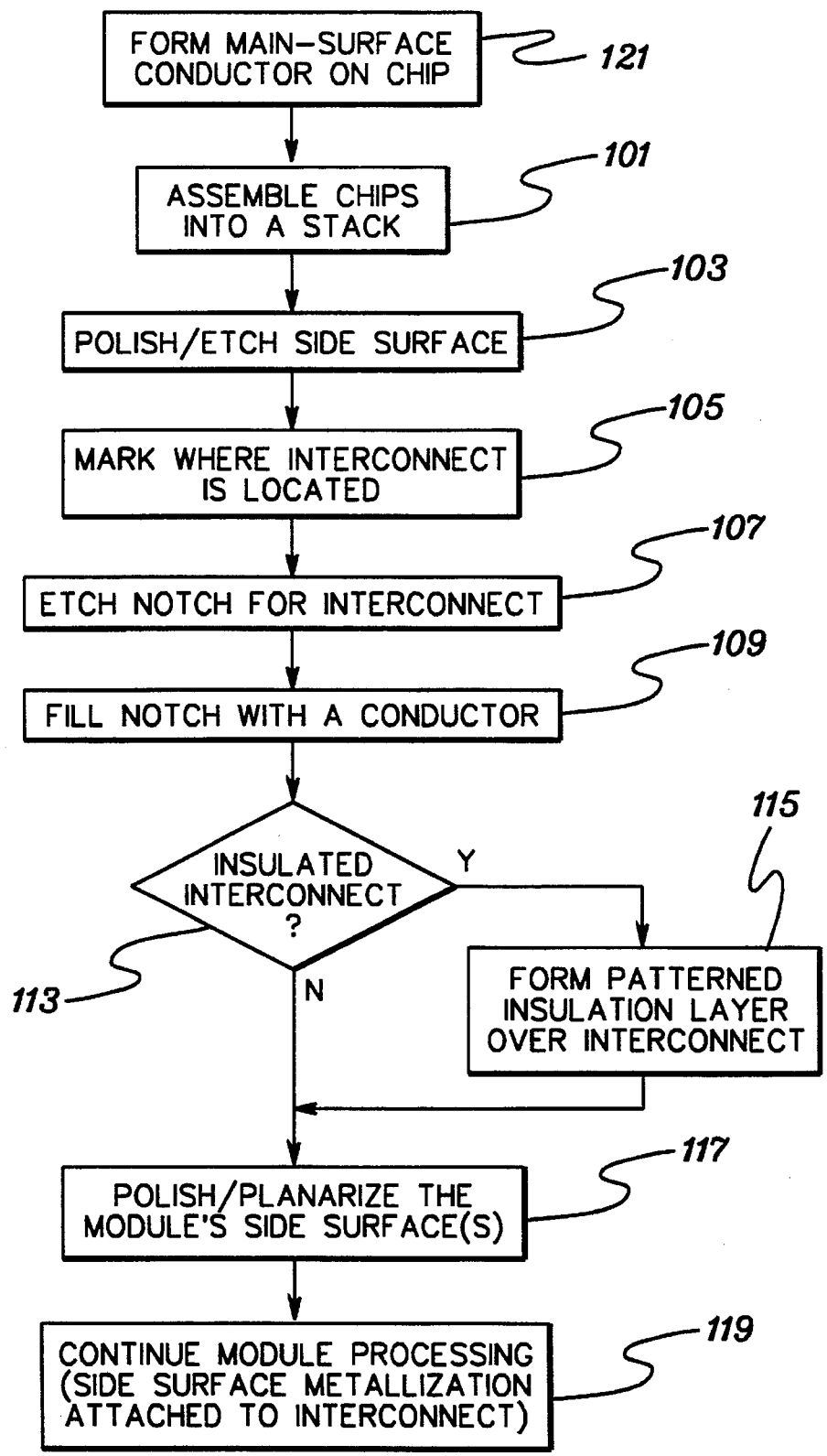
FIG. 3A is a flowchart of an embodiment of a method for forming the interconnect enhanced electronic module of FIG. 3.

An electronic module having a semiconductor chip with a main surface conductor and an interconnect electrically connected thereto is depicted in FIG. 3, with a corresponding method shown in the flowchart of FIG. 3A. As a first process step, as shown in FIG. 3A, a semiconductor chip is provided with a main surface conductor formed thereon (121). Next, the chips are assembled into a stack (101). It should be generally noted that all the chips in the module need not have main surface conductors. Main surface conductors may be provisioned, as necessary, to insure the safe removal of ESD from the module.

As shown in FIG. 3, an electronic module has been provided with a semiconductor chip having a main (back) surface conductor 31. The conductor generally covers (i.e., is coextensive with) the entire main surface of the chip it is attached to. The remaining process steps required to form interconnect 19*c* attached to main surface conductor 31 and side surface metallization 21 are similar to the process previously described herein to form interconnects 19*a* and 19*b* of FIG. 1 (i.e., steps 101, 103, 105,107, 109, 113, 115, 117 and 119).

In regard to this particular embodiment, the "notch" is formed adjacent to main surface conductor 31. Thus, when the notch is filled with a conductor, the resulting interconnect will be in electrical contact with the main surface conductor 31 providing electrical access thereto from side surface 23. It should be noted that neither the main surface conductor nor the interconnect is insulated from the substrate. Insulation is not necessary since the main surface conductor is at ground potential (as is the substrate) for attracting and dissipating the ESD impulse.

As shown in FIG. 4, and described in the method of the flowchart of FIG. 3A, portions of the interconnect may be covered with an insulation layer. After forming the notch containing the conductor, a decision is made whether or not to cover a portion of the conductor with an insulator (113). If insulation is required, a patterned insulation layer is formed over the interconnect (115). As shown in FIG. 4, interconnect 19*e* is covered by insulator 33, exposing contact surface 35 of the interconnect. Connection from the side surface metallization to the interconnect 19*e* is thus made via contact surface 35.

In an alternate embodiment of the present invention shown in the cross-sectional view of FIG. 4A and the persepct view of FIG. 4B, a "ring" shaped interconnect is formed. As shown, the interconnect facilitates electrical connection on all four edge surfaces of the chip (corresponding to four side surfaces of the electronic module the chip is within). Advantageously, when combined with a back surface conductor, a very large surface area electrical connection is formed between the "ring" interconnect and the back surface conductor. Thus, the ring provides external connectivity to the back surface conductor from, as well as interconnection between, all four side surfaces of a electronic module.

In another embodiment, the techniques of the present invention are useful in forming a front face for an electronic module composed of a semiconductor, such as, for example, silicon. This "Silicon Front Face" ("SFF") resides on the end of an electronic module, and provides connection to the module via an end surface. Advantageously, the techniques of the present invention combined with an SFF chip enables the elimination of the conventional ceramic end cap. Thus, the expensive and time-consuming processes related to forming a ceramic end cap can be eliminated. Process embodiments for forming SFF semiconductor chips and resulting structures are shown in FIGS. 5–8A.

The flowchart of FIG. 5B (and accompanying interconnect enhanced SFF chips shown in FIGS. 5–6*a*) shows a method for making an SFF chip, starting with wafer level processes. Typical photolithography masking/processing steps are employed exposing the portion of a main surface of the SFF chip (on a wafer) where the interconnect is to be located (123). Next, the SFF chip is etched (107), forming a notch which will contain the interconnect. An insulator (for example, an oxide) is deposited within the notch to isolate the conductive interconnect from the SFF chip (125). The notch with insulating layer is then filled with a conductor (109). As in the previous embodiments described herein, a decision is then made whether or not to insulate a portion of the interconnect (113). If insulation is desired, a patterned insulation layer is formed over the interconnect (115). Regardless of whether or not a patterned insulation layer is formed, the next process step entails polishing the main surface of the SFF chip (i.e., the wafer, step 127).

After main surface polishing of the SFF chip, appropriate chip metallization layers may be applied to the main surface (129). These may include simple contacts, or an extensive metallization pattern interconnecting various points on the SFF chip. The metallization layers are applied using standard wafer level processing techniques. Thereafter, the wafer is diced (130), yielding the SFF chip(s) for incorporation into the module.

Accordingly, as per the method of FIG. 5B, the SFF chip with a corresponding (optional) front surface metallization layer may be included as the end chip in a stack of chips comprising an electronic module (131). After the module has been assembled, including the SFF chip, a selected side surface(s) is polished, planarizing the surface (117). A second contact surface of the interconnect on the edge of the SFF chip (and side of the module) is thus exposed. Thereafter, module processing may be completed (119). This includes the formation of a metallization pattern on the side surface of the module.

The results of the processing up to this point are shown in FIGS. 5–6A (side and end surface metallization has been omitted for clarity). Referring to FIG. 5, an interconnect 19*f* has been formed within SFF chip 11. The interconnect 19*f* is separated from the substrate 11 by insulating layer 41 (FIG. 5A). Alternatively, the SFF chip of FIG. 6 has had a patterned insulation layer formed over interconnect 19g insulating both the main (front) chip surface 15 and the edge chip surface 18. Particularly, with respect to FIG. 6A, openings 45 and 47 are formed within insulating layer 43 providing two contact surfaces on interconnect 19g.

In this particular embodiment, side surface metallization connects to the SFF interconnect, facilitating electrical connection of the side surface metallization pattern to the front surface contacts or interconnects. As examples, FIGS. 7 and 8 show cross-sectional views of interconnect enhanced electronic modules having SFF chips. Interconnect 19h electrically attaches side surface metallization 21 to SFF front surface metallization 63 (contained in front surface insulating layer 61 and formed during wafer processing previously described herein). Note that the interconnect of FIG. 7 has an insulating "cap" 43, while the interconnect of FIG. 8 does not.

In yet another embodiment of the present invention, creation of the interconnect in the SFF chip is performed after the chip has been included in an electronic module comprising a stack of semiconductor chips. As described by the method shown in the flowchart of FIG. 8A, an SFF chip is provided having I/O wiring to a front SFF surface (133). The front face I/O wiring is formed during wafer processing by the techniques described hereinabove. FIGS. 7 & 8 show an SFF chip having I/O metallization 63 (contained within insulation layer 61 (Note, in the process of the current embodiment, the interconnect (19h) is not yet present).

To continue with the process, a stack of semiconductor chips (an electronic module) is formed with the SFF chip with I/O wiring as an end chip (131). A selected side surface(s) is then planarized (117). In the current embodiment, the mask is designed to locate the interconnect at a position within the SFF chip such that it will electrically connect with pre-existing I/O wiring on a main surface of the SFF chip (135); for example, the positioning shown in FIGS. 7 & 8. The remaining process steps of etching the notch (107), depositing an insulating layer (125), filling the notch with a conductor (109), optionally depositing a patterned insulator (113, 115), planarizing the module side surface (117) and completing the module processing with side surface metallization (119) remain substantially similar to previous processes described herein. Thus, an interconnect enhanced electronic module including an SFF end chip interconnected to side surface metallization has been fabricated.

The techniques of the present invention are not limited to the formation of interconnect structures on side or end surfaces of electronic modules. Similar fabrication techniques may be used to form electronic components integral with surfaces of electronic modules. For example, resistors and capacitors can be formed integral with a substantially planar surface of an electronic module. Advantageously, these resistors and capacitors may be used for power supply decoupling and circuit impedance matching, removing the need for such components on external circuit boards. Thus, higher circuit densities and increased performance (due to closer component/module integration) is achieved.

A component enhanced electronic module containing buried capacitors formed integral with the module's side surface is shown in FIG. 9. Accordingly, a method for making the component enhanced electronic module of FIG. 9 is shown in the flowchart of FIG. 9A. In this particular embodiment, the capacitor has one plate (functioning as a contact surface) (53a) available for external electrical attachment. The other plate comprises the substrate of the chip the capacitor is formed within. The substrate is generally at ground potential, therefore one plate of the capacitor is intrinsically attached to ground.

The method for forming the buried capacitor structure shown in the flowchart of FIG. 9A is similar to previous methods described herein for forming interconnects. The process begins with the assembly of a plurality of integrated circuit ("IC") chips into a stack (101). The side surface of the module to which the transfer metals extend is then polished or etched to expose the ends of the transfer metals and prepare the module for side surface metallization (103). However, prior to the formation of side surface metallization, the capacitor structure is formed. In this regard, a standard photolithographic masking process is employed, exposing a portion of the side surface of the module for etching where the capacitor is to be located (137). For example, as shown in FIG. 9, two buried capacitor structures are illustrated, one integral with two side surfaces of the electronic module, and the other integral with one side surface of the module. An etchant is then used to open up a notch within a surface(s) of the module in which the capacitor will be formed (139).

A dielectric layer is formed within the notch in the module. First, an insulating layer is deposited (125). Next, a nitride layer is deposited over the insulating layer (141). As shown in FIG. 9, layer 55 represents the insulating and nitride layers. These serve to form the dielectric structure of the capacitor. Optionally, only one insulating (dielectric) layer is necessary. In the present embodiment, a two layer structure is used to enhance reliability of the capacitor (two layer dielectrics are generally more reliable than single layer dielectrics).

The remainder of the cavity is then filled with a conductor, forming a plate of the capacitor (FIG. 9A; step 109; FIG. 9, plate 53a). Again, the other plate of the capacitor is intrinsically the substrate. The side surface(s) of the module is (are) then polished, planarizing them for later process steps (117). Thereafter, standard processing of the module may continue (119). This entails the formation of side surface metallization on the module. The capacitor structures formed are connected to the side surface metallization through standard via connections. To generally note, a significant difference between the capacitor structure described herein and the previously described interconnects is the selection of the insulating (and nitride) layer to create a dielectric layer between the metal plate and the substrate. In previous "interconnect" embodiments an insulator was chosen to eliminate any dielectric effect.

The buried capacitor structure described herein, and process to fabricate it, may be easily modified to provide for the formation of buried resistor structures as well. A process to create such resistor structures is shown in the flowchart of FIG. 9B. The resulting structure looks identical to the capacitor structure shown in FIG. 9. However, the size, shape, and resistivity of the conductor is chosen such that a certain resistance is created from one portion of the contact surface of the conductor (53a') to another portion of the contact surface (53a"). Side surface metallization may connect to each of these portions using two electrically conductive vias etched in an above deposited insulation layer (not shown) using standard techniques in the art. Each of the two via connections electrically attaches to one of the two portions of the contact surface as the two "terminals" of the resistor. Further, in the resistor structure, an insulator is deposited such that the conductor is insulated from the substrate and no dielectric effect exists.

To briefly summarize, a process for forming a buried resistor structure is shown in the flowchart of FIG. 9B. A plurality of IC chips are assembled into a stack (101). A selected side surface(s) of the module is then polished or etched to form a substantially planar surface exposing the transfer metals (103). A photolithographic masking process is employed, locating and appropriately sizing the resistor component on a substantially planar surface of the module (137*a*). Particularly, the notch is formed to have a shape that will yield the appropriate resistance across a conductor later deposited therein (i.e., a long narrow notch will have high resistance, while a short wide notch will have low resistance). Accordingly, the notch is etched (139). An insulator is deposited in the notch to electrically isolate the resistor from the substrate (125) and the notch is then filled with a conductor, forming the resistor (109). Again, the conductor is chosen, having appropriate resistivity, such that a desired resistance is achieved across the conductor. Module processing then continues with standard polishing/planarization of selected side surface(s) (117), and standard module side surface processing (119). The side surface metallization is attached to the conductor (forming the resistor) in two locations (FIG. 9, 53*a*' and 53*a*"). Thus, a desired resistance is achieved between these two locations (i.e., contact surfaces) as desired.

In yet another embodiment of the present invention, a buried capacitor structure having two plates available for external connection may be formed integral with the side surface of an electronic module. This component enhanced electronic module is shown in FIGS. 10 & 10*a*, and a corresponding process for forming it is shown in the flowchart of FIG. 10B.

Referring to the flowchart of FIG. 10B, certain steps are similar to those for forming the previously described capacitor structure of FIG. 9. The chips are assembled into a stack (101), a side surface is polished or etched (103), photolithography techniques are employed to mask (137) and etch (139) the side surface to create a notch for the capacitor, and an insulating layer is deposited in the notch (125).

At this point, the method of the current embodiment departs from those previously described herein. The insulating layer deposited (125) is not chosen for a dielectric function, but is chosen to electrically isolate the capacitor formed above it from the substrate. Above the insulation layer, a first conductor is deposited in the notch (143). This metal will serve as the first plate of the capacitor and has as a contact surface. This is shown in FIGS. 10 & 10*a* as plate 53*b*. Next, the dielectric structure between the plates is created. An insulator is deposited over the first conductor, or plate (145) and a nitride layer is deposited over the insulator layer (147). Thus, a two layer dielectric structure has been formed, shown in FIGS. 10 & 10*a* as layer 55'. Again, this two-layer dielectric may be replaced with a single dielectric (insulating) layer. The second plate of the capacitor (i.e., a second contact surface) is then formed by filling the remainder of the notch with a conductor (step 149; FIGS. 10 & 10*a*, plate 53*c*).

Module processing continues in a similar manner to the embodiments previously described hereinabove. The side surfaces of the module are polished, planarizing them (117), and side surface metallization is formed on the module (119). Interconnection between the side surface metallization pattern and the two-plate capacitor is performed via standard stud/metal contacts as known in the art. Each plate (contact surface) of the capacitor is attached to a separate stud leading to the side surface metallization (not shown).

In yet another embodiment of the present invention, a planar capacitor is formed integral with a side surface of an electronic module. The process for forming such a capacitor and resulting structure are shown in the flowchart of FIG. 11A, and the partial perspective view of FIG. 11, respectively.

Regarding the process depicted in the flowchart of FIG. 11A, a plurality of IC chips are assembled into a stack (an electronic module, step 101). As in previous embodiments, a selected side surface(s) of the module is polished or etched to expose the ends of the transfer metallurgy (103). In this particular embodiment, a cavity is not etched in the side surface because the planar capacitor described herein is formed integral with the side surface of the module, residing above the side surface. Accordingly, a dielectric (insulator) is deposited on the module's side surface in the selected location of the capacitor (151). A conductor is then deposited above the dielectric thereby forming a second plate (i.e., having a contact surface) of the capacitor (153).

The resulting structure is shown in FIG. 11. Plate 53*d* is formed above dielectric layer 55 which is formed on the side surface of the electronic module. Module processing then continues using standard side surface metallization techniques and stud/contact processes to connect the side surface metallization to the plate (53*d*) of the formed capacitor (FIG. 11A, step 119). The other plate of the capacitor implicitly comprises the substrate and is maintained at ground potential. A planar capacitor is thus formed integral with the side surface of an electronic module.

As in previous embodiments, a resistor may be alternately formed. To accomplish such, the insulating (dielectric) layer is replaced with a nondielectric insulator. The plate is sized, and formed of a conductor of specific resistivity, such that a resistor of predetermined resistance is formed. As in previous "resistor" embodiments, two connections to the plate will be necessary; a desired resistance is thus affected therebetween (see FIG. 9, contact surface portions 53*a*' and 53*a*").

In another embodiment of the present invention, a stacked capacitor structure may be formed integral with the side surface of the electronic module and above a side surface metallization layer. This embodiment, and a process for fabricating the structure are shown in the partial perspective view of FIG. 12 and the flowchart of FIG. 12A, respectively.

Module fabrication begins with the assembly of a plurality of integrated circuit chips into a stack (FIG. 12A, step 101). Thereafter, a selected side surface(s) of the module is polished or etched to expose the ends of transfer metallurgy (103). At this point, instead of fabricating a capacitor or resistor structure as in previous embodiments, module processing continues with the polishing and planarization of the selected side surface(s) (117). Side surface metallization is then applied to the planarized surface(s) interconnecting the IC chips of the module via the transfer metallurgy (119). An insulator is then deposited over the side surface metallization in accordance with typical electronic module processing (155).

To continue with the process, electrically conductive vias are formed in the insulating layer covering the side surface metallization at locations where connections to capacitors are desired (157). The vias correspond to locations on the metallization pattern designed to attach to the capacitors. Thereafter, the selected side surface of the module having vias is polished, preparing the module for the fabrication of plate capacitors (135).

As a first step in the fabrication of the capacitor, a conductor is deposited on the polished, insulated side surface of the module (161). As shown in FIG. 12, first plate 53c is disposed above the side surface metallization layer 21 (Note: the insulating layers have been omitted for purposes of clarity). As shown in FIG. 12, the first plate 53c is connected to side surface metallization 21 through a post connection 57 (i.e., a metal-filled via in the insulating layer). Next, a dielectric is deposited above the first plate (163), shown as dielectric 55 in FIG. 12. The second plate of the capacitor, formed from a conductor is deposited over the dielectric layer to complete the capacitor (FIG. 12A, step 165, FIG. 12, plate 53e). Connection to the second plate may be achieved through a variety of well known connection means such as, for example, solder bumps, wirebonds or an additional metallization layer disposed above the capacitor. Thus, a two-plate capacitor has been formed integral with the side surface of an electronic module, above side surface metallization.

In yet another embodiment of the present invention, resistors may be formed integral with a side surface of an electronic module, above the side surface metallization. An electronic module having such a resistor, and a method for forming the same, are shown in the cross-sectional view of FIG. 13 and the flowchart of FIG. 13A, respectively. In the initial process steps, an electronic module with side surface metallization is formed. Briefly summarized, a plurality of chips are assembled into a stack (101). A selected side surface is then polished or etched to expose the ends of the transfer metals (103). Thereafter, standard side surface processing continues with the application of a side surface metallization pattern interconnecting the various chips in the module and protective insulating layer thereabove (119).

Specific process steps are then performed, fabricating a component (resistor) enhanced electronic module. A plurality of electrically conductive vias (element 57 of FIG. 13) are formed in the insulating layer (13') encasing the side surface metallization pattern (step 167). A conductor is then deposited on the side (insulated) surface of the module (169). The conductor is etched (171) to form resistive interconnects between the electrically conductive vias (electrically connected to the side surface metallization). The composition of the conductor, thickness of the conductor deposited and the width of the conductor etched, interact to form resistors between the electrically conductive vias.

As shown in FIG. 13, etched conductor (resistor) 61 is patterned to electrically attach to the two electrically conductive vias 57 that attach to respective side surface metallization. A protective insulating layer (13") is then formed over the resistors protecting them (FIG. 13a, 173). Thus, a component enhanced electronic module has been formed with resistors disposed above side surface metallization, integral with a side surface of the electronic module.

As will be apparent to one of ordinary skill in the art, the semiconductor structures and methods of the present invention include numerous advantages. An interconnect enhanced electronic module has simplified connections between surfaces of the electronic module. For example, two side surface metallization patterns may be interconnected by adjoining them to a common interconnect in accordance with the present invention. Similarly, an end surface metallization pattern may be interconnected to a side surface metallization pattern. Such technique eliminates the fabrication and reliability problems associated with modified T-Connects, and other interconnects that "wrap around" an edge surface of an electronic module.

Moreover, advantages are derived when a main surface conductor is disposed on a semiconductor chip and electrically attached to an interconnect as proposed herein. Main surface conductors facilitate electrostatic discharge ("ESD") removal since they draw the ESD impulse to the bulk substrate, and away from the resistive epitaxial regions of the chip.

The techniques of the present invention allow for the elimination of the conventional ceramic end cap, and associated costly processing. An interconnect as described herein is used to connect a side surface to an end surface on the electronic module. The interconnect thus replaces the function of the ceramic end cap. This interconnect may be easily formed either after fabrication of the electronic module, or on a silicon wafer prior to dicing the wafer into chips for inclusion in the electronic module.

As another advantage, components formed integral with a surface of an electronic module facilitate a better performing electronic module. The component enhanced electronic module may be used to eliminate ring back associated with impedance mismatch. Further, the components may provide a power supply decoupling function. All of this is provided directly on the electronic module, without the need for the inclusion of componentry (resistors and capacitors) on external circuit boards.

While the invention has been described in detail herein, in accordance with certain preferred embodiments thereof, many modifications and changes therein may be affected by those skilled in the art. Accordingly, it is intended by the appended claims to cover all such modifications and changes as fall within the true spirit and scope of the invention.

What is claimed is:

1. A component enhanced electronic module comprising:

an electronic module comprising a plurality of stacked integrated circuit ("IC") chips, said electronic module having a side surface; and an electronic component formed integral with said side surface of said electronic module.

2. The component enhanced electronic module of claim 1, wherein said electronic module contains a first IC chip of said plurality of stacked IC chips, said first IC chip having a substrate, and wherein said electronic component is at least partially contained within said substrate of said first IC chip.

3. The component enhanced electronic module of claim 2, wherein said electronic module includes a plurality of electronic components formed integral with said side surface, and wherein said substrate of said first IC chip has said plurality of electronic components at least partially contained therein.

4. The component enhanced electronic module of claim 1, further comprising an insulating layer disposed between said side surface of the electronic module and said electronic component.

5. The component enhanced electronic module of claim 4, wherein said insulating layer comprises a dielectric layer and wherein said electronic module includes an electrical conductor disposed above said dielectric layer such that a capacitor is formed having said electrical conductor as a first plate of said capacitor and said substrate as a second plate.

6. The component enhanced electronic module of claim 4, wherein said electronic module includes an electrical conductor disposed above said insulating layer, said electrical conductor having a predetermined electrical resistivity such that a predetermined electrical resistance exists between a first portion of said electrical conductor and a second portion of said electrical conductor.

7. The component enhanced electronic module of claim 1, wherein said electronic component includes two electrical conductors, each conductor having an electrical contact surface disposed substantially flush with said side surface, wherein each electrical contact surface functions as terminal of said electronic component.

8. The component enhanced electronic module of claim 7, wherein said electronic component includes a dielectric layer disposed between said two electrical conductors such that a capacitor is formed from said two electrical conductors and said dielectric layer.

9. The component enhanced electronic module of claim 1, further comprising a metallization layer disposed adjacent to said side surface, such that said electronic component is disposed above said metallization layer, wherein said electronic component includes an electrical contact electrically coupled to said metallization layer such that said metallization layer is electrically attached to said electronic component.

10. The component enhanced electronic module of claim 1, wherein said electronic component includes an electrical contact surface, said electrical contact surface being flush with said side surface of said electronic module.

11. The component enhanced electronic module of claim 1, wherein said electronic component is one of a capacitor and a resistor.

12. The component enhanced electronic module of claim 1, wherein said electronic module includes two side surfaces, and wherein said electronic component is formed integral with said two side surfaces.

13. An interconnect enhanced electronic module comprising:

an electronic module comprising a plurality of semiconductor chips organized in a stack, each semiconductor chip having multiple edge surfaces and two main surfaces such that when stacked, said electronic module has side surface and end surfaces, each side surface being defined by and parallel to a plurality of aligned edge surfaces of the plurality of semiconductor chips, each end surface being parallel to the main surfaces of the plurality of semiconductor chips, said electronic module comprising multiple substantially planar surfaces of which each substantially planar surface comprises one of an end surface and a said surface, said electronic module having a first substantially planar surface of said multiple substantially planar surfaces and a second substantially planar surface of said multiple substantially planar surfaces, said first substantially planar surface comprising a side surface of said electronic module, said second substantially planar surface being disposed perpendicular to said first substantially planar surface;

an interconnect comprising an at least partially conductor filled notch, said at least partially conductor filled notch intersecting both said first substantially planar surface, and said second substantially planar surface, such that said interconnect has a first contact surface and a second contact surface, said first contact surface being parallel to said first substantially planar surface and said second contact surface being parallel to said second substantially planar surface; and a metallization layer disposed on said first substantially planar surface and comprising an integral part of said electronic module itself, said metallization layer being electrically connected to said first contact surface, wherein said interconnect facilitates electrical interconnection between said metallization layer and said second substantially planar surface of the electronic module.

14. The interconnect enhanced electronic module of claim 13, wherein a first semiconductor chip of said plurality of semiconductor chips includes a substantially planar main surface having a main surface conductor disposed thereon, and wherein said interconnect electrically and at least partially mechanically connects to said main surface conductor of said semiconductor chip.

15. The interconnect enhanced electronic module of claim 14, wherein the main surface conductor is coextensive with the substantially planar main surface of the first semiconductor chip.

16. The interconnect enhanced electronic module of claim 13, wherein said second substantially planar surface of said electronic module comprises a substantially planar end surface of said electronic module.

17. The interconnect enhanced electronic module of claim 16, wherein said electronic module includes a metallization layer disposed above and coupled to said substantially planar end surface, said metallization layer being electrically connected to said first contact surface of said interconnect.

18. The interconnect enhanced electronic module of claim 13, wherein said first substantially planar surface of the electronic module terminates at a first edge and a second edge, said second edge being parallel to said first edge, and wherein said first contact surface of said interconnect extends between said first edge to said second edge.

19. The interconnect enhanced electronic module of claim 13, wherein said electronic module includes three substantially planar side surfaces, said first substantially planar surface comprising a first substantially planar side surface of said three substantially planar side surfaces, said second substantially planar surface comprising a second substantially planar side surface of said three substantially planar side surfaces, and wherein said interconnect further comprises a third contact surface parallel to a third substantially planar side surface of said three substantially planar side surfaces, and wherein said interconnect facilitates electrical interconnection between said three substantially planar side surfaces.

20. The interconnect enhanced electronic module of claim 13, wherein said electronic module includes four substantially planar side surfaces, said first substantially planar surface comprising a first substantially planar side surface of said four substantially planar side surfaces, said second substantially planar surface comprising a second substantially planar side surface of said four substantially planar side surfaces, and wherein said interconnect further comprises a third contact surface parallel to a third substantially planar side surface of said four substantially planar side surface and a fourth contact surface parallel to a fourth substantially planar side surface of said four substantially planar side surfaces, and wherein said interconnect facilitates electrical interconnection between said four substantially planar side surfaces.

21. The interconnect enhanced electronic module of claim 13, further comprising a patterned insulating layer disposed on said first contact surface such that a first portion of said first contact surface is electrically insulated and a second portion of said first contact surface is exposed for electrical connection.

22. An interconnect enhanced semiconductor chip comprising:

a semiconductor chip having a first substantially planar surface and a second substantially planar surface, said second substantially planar surface being disposed perpendicular to said first substantially planar surface;

an interconnect comprising an at least partially conductor filled notch intersecting said first substantially planar surface, said second substantially planar surface and at most one main surface of said semiconductor chip, said interconnect having a first contact surface and a second contact surface, said first contact surface being parallel to said first substantially planar surface, and said second contact surface being parallel to said second substantially planar surface; and wherein said interconnect facilitates electrical interconnection between said first substantially planar surface of the semiconductor chip and said second substantially planar surface of the semiconductor chip.

23. The interconnect enhanced semiconductor chip of claim 22, wherein said first substantially planar surface comprises an edge surface of said semiconductor chip and said second substantially planar surface comprises a main surface of said semiconductor chip.

24. The interconnect enhanced semiconductor chip of claim 23, further comprising a metallization layer disposed above and mechanically coupled to said main surface, said metallization layer being electrically coupled to said interconnect.

25. The interconnect enhanced semiconductor chip of claim 22, further comprising a first patterned insulating layer above said first contact surface such that a first portion of said first contact surface is electrically insulated and a second portion of said first contact surface is exposed for electrical contact to said first substantially planar surface of said semiconductor chip.

26. The interconnect enhanced semiconductor chip of claim 25, further comprising a second patterned insulating layer above said second contact surface such that a first portion of said second contact surface is insulated and a second portion of said second contact surface is exposed for electrical contact to said second substantially planar surface of said semiconductor chip.

27. The interconnect enhanced semiconductor chip of claim 22, wherein said at least partially conductor filled notch includes an insulating layer, said insulating layer being disposed between the conductor of said at least partially conductor filled notch and said semiconductor chip within which said notch is disposed.

28. A component enhanced semiconductor chip comprising:

a semiconductor chip having an edge surface; and an electronic component formed integral with said edge surface.

29. The component enhanced semiconductor chip of claim 28, wherein said semiconductor chip has two edge surfaces and said electronic component is formed integral with said two edge surfaces.

30. The component enhanced semiconductor chip of claim 28, wherein said semiconductor chip includes a substrate and wherein said electronic component comprises a capacitor, said substrate comprising a first plate of said capacitor.

31. The component enhanced semiconductor chip of claim 28, wherein said semiconductor chip includes a notch in said edge surface, and wherein said electronic component is at least partially contained within said notch.

32. A component enhanced electronic module comprising:

an electronic module comprising a plurality of stacked integrated circuit ("IC") chips, said electronic module having a side surface;

one of an electronic component and an interconnect formed integral with said side surface of said electronic module; and an insulating layer disposed between said electronic module and said one of said electronic component and said interconnect.

33. An interconnect enhanced electronic module comprising:

an electronic module comprising a plurality of stacked semiconductor chips, said electronic module having a first substantially planar surface and a second substantially planar surface, said second substantially planar surface being disposed perpendicular to said first substantially planar surface;

an interconnect comprising an at least partially conductor filled notch, said at least partially conductor filled notch intersecting both said first substantially planar surface and said second substantially planar surface, such that said interconnect has a first contact surface and a second contact surface, said first contact surface being parallel to said first substantially planar surface and said second contact surface being parallel to said second substantially planar surface;

an insulating layer disposed between said interconnect and said electronic module; and wherein said interconnect facilitates electrical interconnection between said first substantially planar surface of the electronic module and said second substantially planar surface of the electronic module.

34. An interconnect enhanced semiconductor chip comprising:

a semiconductor chip having a first substantially planar surface and a second substantially planar surface, said second substantially planar surface being disposed perpendicular to said first substantially planar surface;

an interconnect comprising an at least partially conductor filled notch intersecting both said first substantially planar surface and said second substantially planar surface, said interconnect having a first contact surface and a second contact surface, said first contact surface being parallel to said first substantially planar surface, and said second contact surface being parallel to said second substantially planar surface;

an insulating layer disposed between said interconnect and said electronic module; and wherein said interconnect facilitates electrical interconnection between said first substantially planar surface of the semiconductor chip and said second substantially planar surface of the semiconductor chip.

35. A component enhanced semiconductor chip comprising:

a semiconductor chip having an edge surface; and one of an electronic component and an interconnect formed integral with said edge surface; and an insulating layer disposed between said electronic module and said one of said electronic component and said interconnect.

36. The interconnect enhanced electronic module of claim 13, further comprising a patterned insulating layer disposed on said second contact surface such that a first portion of said second contact surface is electrically insulated and a second portion of said second contact surface is exposed for electrical connection.

* * * * *

UNITED STATES PATENT AND TRADEMARK OFFICE
CERTIFICATE OF CORRECTION

PATENT NO. : 5,521,434
DATED : May 28, 1996
INVENTOR(S) : Cronin et al.

It is certified that error appears in the above-indentified patent and that said Letters Patent is hereby corrected as shown below:

In the Claims:

Column 15, line 40, delete "said" (first occurrence) and substitute therefor --side--.

Signed and Sealed this

Twenty-fifth Day of February, 1997

Attest:

BRUCE LEHMAN

*Attesting Officer*  *Commissioner of Patents and Trademarks*